US011950461B2

(12) United States Patent
Long et al.

(10) Patent No.: US 11,950,461 B2
(45) Date of Patent: Apr. 2, 2024

(54) DISPLAY SUBSTRATE AND DISPLAY APPARATUS

(71) Applicants: Chengdu BOE Optoelectronics Technology Co., Ltd., Sichuan (CN); BOE Technology Group Co., Ltd., Beijing (CN)

(72) Inventors: Yue Long, Beijing (CN); Weiyun Huang, Beijing (CN); Chao Zeng, Beijing (CN); Yao Huang, Beijing (CN); Meng Li, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 922 days.

(21) Appl. No.: 16/964,638

(22) PCT Filed: Aug. 1, 2019

(86) PCT No.: PCT/CN2019/098936
§ 371 (c)(1),
(2) Date: Jul. 24, 2020

(87) PCT Pub. No.: WO2021/017010
PCT Pub. Date: Feb. 4, 2021

(65) Prior Publication Data
US 2023/0011418 A1    Jan. 12, 2023

(51) Int. Cl.
*H01L 33/38*     (2010.01)
*H10K 50/844*    (2023.01)
(Continued)

(52) U.S. Cl.
CPC ......... *H10K 59/131* (2023.02); *H10K 50/844* (2023.02); *H10K 59/1201* (2023.02); *H10K 71/00* (2023.02)

(58) Field of Classification Search
CPC ............... H10K 59/131; H10K 50/844; H10K 59/1201; H10K 71/00
See application file for complete search history.

(56) References Cited

U.S. PATENT DOCUMENTS

2002/0047567 A1    4/2002  Fujita et al.
2004/0084673 A1    5/2004  Hirakata et al.
(Continued)

FOREIGN PATENT DOCUMENTS

CN    1503602 A      6/2004
CN    103325337 A    9/2013
(Continued)

OTHER PUBLICATIONS

International search report of PCT application No. PCT/CN2019/098936 dated Apr. 21, 2020.
(Continued)

*Primary Examiner* — Samuel Park
(74) *Attorney, Agent, or Firm* — Lippes Mathias LLP

(57) ABSTRACT

Provided is a display substrate including a base substrate, a plurality of pixel units, at least one first power line, a barrier structure, an adapting structure, a cathode layer and a first organic pattern. By covering at least part of the second side face of the adapting structure with the first organic pattern, the risk of the second side face of the adapting structure being eroded by moisture or oxygen due to the etching defects can be reduced.

18 Claims, 15 Drawing Sheets

(51) Int. Cl.
*H10K 59/131* (2023.01)
*H10K 59/12* (2023.01)
*H10K 71/00* (2023.01)

(56) References Cited

U.S. PATENT DOCUMENTS

| | | | |
|---|---|---|---|
| 2004/0100191 | A1 | 5/2004 | Park |
| 2012/0256973 | A1 | 10/2012 | Choi et al. |
| 2013/0249877 | A1 | 9/2013 | Choi et al. |
| 2015/0372072 | A1 | 12/2015 | Xiong et al. |
| 2016/0035274 | A1* | 2/2016 | Kwon .................. H01L 27/124 345/82 |
| 2017/0141352 | A1 | 5/2017 | Shin |
| 2017/0323936 | A1 | 11/2017 | Lee et al. |
| 2017/0331058 | A1* | 11/2017 | Seo ........................ H10K 59/50 |
| 2017/0365814 | A1 | 12/2017 | Kim et al. |
| 2018/0033998 | A1 | 2/2018 | Kim et al. |
| 2018/0151838 | A1* | 5/2018 | Park ....................... G06F 3/0412 |
| 2019/0198800 | A1 | 6/2019 | Kim et al. |
| 2019/0221625 | A1 | 7/2019 | Go et al. |
| 2019/0296098 | A1 | 9/2019 | Cheng et al. |
| 2021/0296425 | A1* | 9/2021 | Ochi .................... H10K 59/131 |
| 2021/0351263 | A1* | 11/2021 | Okabe ................. H10K 50/844 |

FOREIGN PATENT DOCUMENTS

| | | |
|---|---|---|
| CN | 103700694 A | 4/2014 |
| CN | 104091818 A | 10/2014 |
| CN | 105977273 A | 9/2016 |
| CN | 106711171 A | 5/2017 |
| CN | 107527551 A | 12/2017 |
| CN | 108493217 A | 9/2018 |
| CN | 108615743 A | 10/2018 |
| CN | 109148720 A | 1/2019 |
| CN | 110021638 A | 7/2019 |
| JP | 2002083691 A | 3/2002 |
| JP | 2017215589 A | 12/2017 |

OTHER PUBLICATIONS

China National Intellectual Property Administration, First office action of Chinese application No. 201980001236.8 dated Jun. 1, 2022, which is foreign counterpart application of this US application.

Extended European search report of counterpart European application No. 19933222.2 dated Jul. 13, 2022.

* cited by examiner

DISPLAY SUBSTRATE AND DISPLAY APPARATUS

CROSS-REFERENCE TO RELATED APPLICATION

The present application is a 371 of PCT Application No. PCT/CN2019/098936, filed on Aug. 1, 2019 and entitled "DISPLAY SUBSTRATE AND DISPLAY APPARATUS", which is incorporated herein by reference in its entirety.

TECHNICAL FIELD

The present disclosure relates to the field of display technologies, and in particular to a display substrate and a display apparatus.

BACKGROUND

A display substrate typically includes a plurality of pixel units arranged in an array on a display region of a base substrate, a power trace (generally referred to as a VDD trace) for providing signals from positive power source to each pixel unit, and a power trace (generally referred to as a VSS trace) for providing signals from negative power source to a cathode layer in the display substrate. When the power traces enter an encapsulation region from a side where a driving chip locates, for example, when the power traces pass across a bank structure (i.e., near the portion of the bank structure where the power line passes across the bank structure, namely, the line incoming port) into a region close to the pixel units from a bonding region, there is a risk of bringing in the moisture and oxygen, and thus there is a need to improve the encapsulation performance.

SUMMARY

The present disclosure provides a display substrate and a display apparatus. The technical solutions are as follows.

In one aspect, a display substrate is provided, which includes:
a base substrate;
a plurality of pixel units located on the base substrate;
at least one first power line located on the base substrate;
a barrier structure surrounding the plurality of pixel units;
an adapting structure including a first side face and a second side face opposite to the first side face, the first side face being closer to the plurality of pixel units than the second side face;
a cathode layer located on a side of the adapting structure distal from the base substrate; and
a first organic pattern located on the side of the adapting structure distal from the base substrate,
wherein one end of the at least one first power line is located on a side of the barrier structure distal from the plurality of pixel units, and is configured for receiving power signals; and the other end of the at least one first power line is located between the barrier structure and the plurality of pixel units, and is connected to the cathode layer through the adapting structure, and
wherein the first organic pattern covers at least a portion of the second side face, an orthographic projection of the first organic pattern on the base substrate and an orthographic projection of the at least one first power line on the base substrate overlap at a first overlapping region, and the first overlapping region and an orthographic projection of the barrier structure on the base substrate do not overlap.

Optionally, the second side face includes a portion covered by the first organic pattern and a portion covered by the barrier structure.

Optionally, the one end of the at least one first power line is located in a middle portion on the side of the barrier structure distal from the plurality of pixel units.

Optionally, a distance between the first overlapping region and the orthographic projection of the barrier structure on the base substrate is greater than a distance threshold.

Optionally, the distance threshold is in a range from 80 microns to 150 microns.

Optionally, the display substrate further includes: at least one second power line, wherein the at least one second power line includes a first portion and a second portion;
the first portion is located on the side of the barrier structure distal from the plurality of pixel units, and is configured for receiving a power signal;
the second portion is connected to the cathode layer through the adapting structure; and
the second portion includes a first junction and a second junction that are connected to the adapting structure, and a distance between the first junction and the barrier structure is greater than a distance between the second junction and the barrier structure.

Optionally, the display substrate has a bonding region located on the side of the barrier structure distal from the plurality of pixel units; and
the first junction is closer to the bonding region than the second junction.

Optionally, the display substrate further includes: a row driving region between the plurality of pixel units and the barrier structure; and
a distance between the orthographic projection of the at least one first power line on the base substrate and the row driving region is greater than a distance between an orthographic projection of the at least one second power line on the base substrate and the row driving region.

Optionally, an orthographic projection of the adapting structure on the base substrate has a first projection region and a second projection region, the first projection region and the orthographic projection of the barrier structure on the base substrate do not overlap, and the second projection region and the orthographic projection of the barrier structure on the base substrate overlap at a second overlapping region; and
wherein the first projection region is closer to the end of the at least one first power line for receiving the power signal, than the second projection regions.

Optionally, the adapting structure is in a ring construction surrounding the plurality of pixel units.

Optionally, the display substrate further includes:
a passivation layer covering the at least one first power line,
wherein an opening is further provided in the passivation layer, the adapting structure is connected to the at least one first power line through the opening at a side proximal to the base substrate, and the adapting structure is connected to the cathode layer at a side distal from the base substrate.

Optionally, the barrier structure includes: a first barrier dam and a second barrier dam;

the first barrier dam is farther from the plurality of pixel units relative to the second barrier dam, and a thickness of the first barrier dam is greater than a thickness of the second barrier dam;

the first barrier dam includes: a first planarization layer pattern, a second planarization layer pattern, and a second organic pattern which are arranged along a direction away from the base substrate;

the second barrier dam includes: a third planarization layer pattern and a third organic pattern which are arranged along a direction away from the base substrate, wherein the second planarization layer pattern and the third planarization layer pattern include a same material, and the first organic pattern, the second organic pattern and the third organic pattern include a same material.

Optionally, the barrier structure includes: a first barrier dam and a second barrier dam;

the first barrier dam is farther from the plurality of pixel units relative to the second barrier dam, and a thickness of the first barrier dam is greater than a thickness of the second barrier dam;

the first barrier dam includes: a planarization layer pattern and a second organic pattern which are sequentially arranged in layers along a direction away from the base substrate;

the second barrier dam includes: a third organic pattern arranged on the base substrate, and wherein the first organic pattern, the second organic pattern and the third organic pattern include a same material.

Optionally, the first barrier dam further includes: a fourth organic pattern arranged on a side of the second organic pattern distal from the base substrate;

the second barrier dam further includes: a fifth organic pattern arranged on a side of the third organic pattern distal from the base substrate; and the fourth organic pattern and the fifth organic pattern include a same material.

Optionally, the barrier structure includes: a first barrier dam and a second barrier dam;

the first barrier dam is farther from the plurality of pixel units relative to the second barrier dam, and a thickness of the first barrier dam is greater than a thickness of the second barrier dam;

the first organic pattern has a portion which is in direct contact with the second barrier dam.

Optionally, the second power line in the display substrate includes: a straight portion and an arc-shaped portion which surround a region where the plurality of pixel units are located; and an orthographic projection of the portion of the first organic pattern which is in direct contact with the second barrier dam on the base substrate is located within an orthographic projection of the arc-shaped portion on the base substrate.

Optionally, the straight portion and the arc-shaped portion which surround the region where the plurality of pixel units are located are included in the second portion of the second power line.

Optionally, the first barrier dam is a first ring, and the second barrier dam is a second ring;

the first organic pattern and a part of the third organic pattern define a third ring, an orthographic projection of the third ring on the base substrate is located within an orthographic projection of the second ring on the base substrate, and the orthographic projection of the second ring on the base substrate is located within an orthographic projection of the first ring on the base substrate, wherein the third ring surrounds the plurality of pixel units.

Optionally, the at least one first power line includes: a first metal layer; the display substrate further includes: an auxiliary metal layer located on a side of the first metal layer distal from the base substrate; and the auxiliary metal layer is in contact with the adapting structure at a side distal from the first metal layer, and an orthographic projection of the auxiliary metal layer on the base substrate and an orthographic projection of the barrier structure on the base substrate do not overlap.

Optionally, the first metal layer, the passivation layer, the first planarization layer pattern, the auxiliary metal layer, the second planarization layer pattern, and the first organic pattern in the display substrate are arranged in layers along a direction away from the base substrate.

Optionally, the at least one first power line includes: a first metal layer and a second metal layer which are arranged along a direction away from the base substrate; and the second metal layer is in contact with the adapting structure at a side distal from the first metal layer.

Optionally, the first metal layer, the first planarization layer pattern, the second metal layer, the passivation layer, the second planarization layer pattern, and the first organic pattern in the display substrate are arranged in layers along a direction away from the base substrate.

Optionally, a plurality of tooth-shaped protruding structures are provided on a side face of the at least one first power line at the end of the barrier structure distal from the plurality of pixel units.

Optionally, an orthographic projection of the protruding structures on the base substrate and the orthographic projection of the barrier structure on the base substrate do not overlap.

Optionally, the display substrate further includes: an encapsulation film layer, wherein the encapsulation film layer is located on a side of the first power line distal from the base substrate, and the encapsulation film layer covers a region surrounded by the barrier structure.

Optionally, the display substrate further includes: a plurality of third power lines located on the base substrate, wherein the plurality of third power lines are electrically connected to transistors in the pixel units.

Optionally, an orthographic projection of at least one of the plurality of third power lines on the base substrate is adjacent to the orthographic projection of the first power line on the base substrate; and an orthographic projection of the plurality of third power lines on the base substrate and the orthographic projection of the adapting structure on the base substrate have a superimposing region, and a passivation layer is disposed between the plurality of third power lines and the adapting structure and within the superimposing regions.

In another aspect, a display substrate is provided, which includes:

a base substrate;

a plurality of pixel units located on the base substrate;

at least one power line located on the base substrate;

a barrier structure surrounding the plurality of pixel units, wherein an orthographic projection of the power line on the base substrate passes across an orthographic projection of the barrier structure on the base substrate;

an adapting structure including a first side face and a second side face opposite to the first side face, wherein the first side face is closer to the plurality of pixel units than the second side face;

a cathode layer located on a side of the adapting structure distal from the base substrate;

a first organic pattern located on the side of the adapting structure distal from the base substrate; and a passivation layer covering the at least one power line, wherein an opening is further provided in the passivation layer, the adapting structure is connected to the at least one power line through the opening at a side proximal to the base substrate, and the adapting structure is connected to the cathode layer at a side distal from the base substrate.

Optionally, the at least one power line includes: a first metal layer; the display substrate further includes: an auxiliary metal layer located on a side of the first metal layer distal from the base substrate; and the auxiliary metal layer is in contact with the adapting structure at a side distal from the first metal layer.

Optionally, the at least one power line includes: at least one first power line; and one end of the at least one first power line is located in a middle portion on the side of the barrier structure distal from the plurality of pixel units.

Optionally, an orthographic projection of the auxiliary metal layer located on a side, distal from the base substrate, of the first metal layer included in the at least one first power line on the base substrate does not overlap the orthographic projection of the barrier structure on the base substrate.

Optionally, the first metal layer, the passivation layer, the first planarization layer pattern, the auxiliary metal layer, the second planarization layer pattern, and the first organic pattern in the display substrate are arranged in layers along a direction away from the base substrate.

Optionally, the at least one power line includes: a first metal layer and a second metal layer which are disposed along a direction away from the base substrate; and the second metal layer is in contact with the adapting structure at a side distal from the first metal layer.

Optionally, the first metal layer, the first planarization layer pattern, the second metal layer, the passivation layer, the second planarization layer pattern, and the first organic pattern in the display substrate are arranged in layers along a direction away from the base substrate.

In yet another aspect, a display apparatus is provided, which includes: the display substrate in the above aspect.

The technical solutions provided by the present disclosure at least include the following beneficial effects.

The present disclosure provides a display substrate and a display apparatus. The display substrate includes a base substrate, a plurality of pixel units, at least one first power line, a barrier structure, an adapting structure, a cathode layer and a first organic pattern. By covering at least part of the second side face of the adapting structure with the first organic pattern, the risk of the second side face of the adapting structure being eroded by moisture or oxygen due to the etching defects can be reduced, thereby guaranteeing that the adapting structure can effectively transmit power signals from the first power line. Moreover, as the first organic pattern is spaced apart from the barrier structure, the moisture brought in by the end of the first power line for receiving power signals can be prevented from being introduced into the pixel units through the barrier structure and the first organic pattern, thereby guaranteeing the yield of the display substrate, as well as the display effect of the display substrate.

BRIEF DESCRIPTION OF THE DRAWINGS

In order to describe the technical solutions in the embodiments of the present disclosure more clearly, the following briefly introduces the accompanying drawings required for describing the embodiments. Apparently, the accompanying drawings in the following description show merely some embodiments of the present disclosure, and a person of ordinary skill in the art can also derive other drawings from these accompanying drawings without creative efforts.

DETAILED DESCRIPTION

For clearer descriptions of the objectives, technical solutions and advantages in the present disclosure, the present disclosure is described in detail below in combination with the accompanying drawings.

In the related art, to reduce the risks due to the moisture and oxygen carried by the power traces entering the encapsulation region from the outside of the encapsulation region, the number of power traces entering the encapsulation region is generally reduced. As such, to guarantee the electrical signal transmission of the power traces, for example, to guarantee the electric connection between the cathodic VSS traces and the cathode, after one end of the VSS trace enters the encapsulation region, for example, a bank structure (i.e. a barrier structure), and the VSS trace is needed to be connected with the cathode layer through an adapting structure which is located within the encapsulation region of the base substrate. However, the inventor has found that although the lap joint effect of cathode and the cathodic power line can be improved by adding the adapting structure such as a conductive metal structure in such a way, an etching defect may exist on the side face of the adapting structure due to such configuration of the adapting structure. This also increases the risks of moisture and oxygen erosions near the line incoming port.

Figure 1:
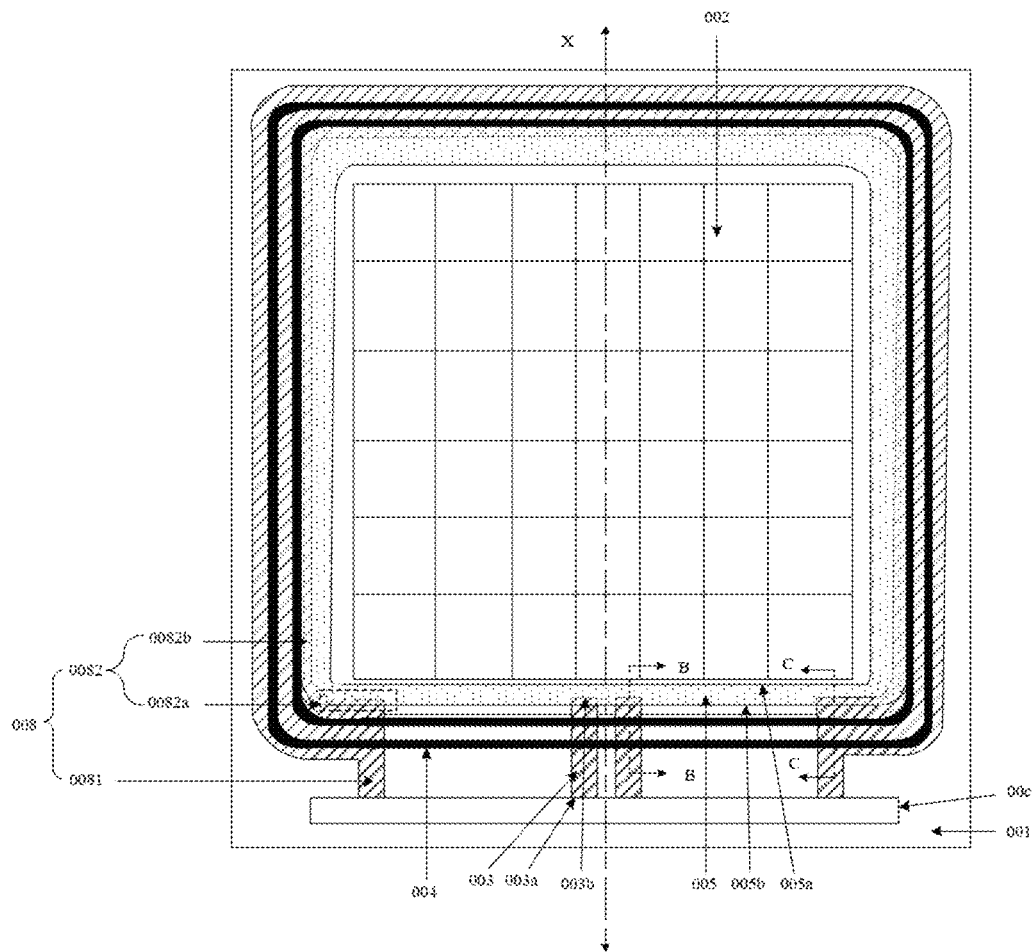
FIG. 1 is a schematic structural diagram of a display substrate according to an embodiment of the present disclosure.
Figure 2:
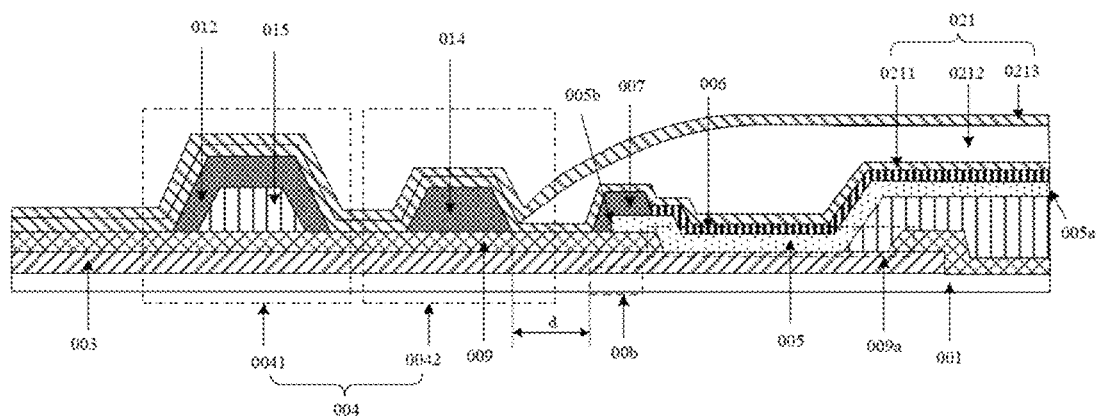
FIG. 2 is a sectional view of the display substrate shown in FIG. 1 taken along a direction of BB.

FIG. 1 is a schematic structural diagram of a display substrate according to an embodiment of the present disclosure. FIG. 2 is a sectional view of the display substrate shown in FIG. 1 taken along a direction of BB. The display substrate may be a flexible panel, and for example, may be a foldable panel. As can be seen with reference to FIGS. 1 and 2, the display substrate may include a base substrate 001, a plurality of pixel units 002, at least one first power line 003 a barrier structure 004, an adapting structure 005, a cathode layer 006 and a first organic pattern 007. The plurality of pixel units 002 may be located on the base substrate 001. To clearly demonstrate the adapting structure 005, the cathode layer 006 is not shown in FIG. 1.

Among them, the at least one first power line 003 is located on the base substrate 001. The barrier structure 004 may surround the plurality of pixel units 002. The adapting structure 005 may include a first side face 005a and a second side face 005b opposite to each other. The side face 005a is closer to the plurality of pixel units 002 than the second side face 005b. The cathode layer 006 may be located on a side of the adapting structure 005 distal from the base substrate 001. The first organic pattern 007 may be located on the side of the adapting structure 005 distal from the base substrate 001.

One end 003a of the at least one first power line 003 is located on a side of the barrier structure 004 distal from the plurality of pixel units 002 and is configured for receiving power signals. The other end 003b is located between the barrier structure 004 and the plurality of pixel units 002 and is connected to the cathode layer 006 through the adapting structure 005, thereby enabling the first power line 003 to provide power signals to the cathode layer 006.

In an embodiment of the present disclosure, the end 003a of each first power line 003 is located outside the region surrounded by the barrier structure (a bank structure) 004, and the other end is located within the region surrounded by the barrier structure 004. That is, each first power line 003 can pass through the barrier structure 004 to enter the region surrounded by the barrier structure 004. Among them, a portion of the barrier structure 004 which is configured for allowing the power line to pass through can also be referred to as a line incoming port. For example, the portion allowing the first power line 003 to pass through may be referred to as a first line incoming port 00a.

Exemplarily, two first power lines 003 are illustrated in FIG. 1, and the end 003a of each first power line 003 may be connected to a driving chip for receiving power signals provided by the driving chip.

As can be seen with reference to FIGS. 1 and 2, the first organic pattern 007 may cover at least part of the second side face 005b of the adapting structure 005; the orthographic projection of the first organic pattern 007 first power line 003 and the orthographic projection of the at least one first power line 003 on the base substrate 001 may overlap at the first overlapping region 00b, and the first overlapping region 00b and the orthographic projection of the barrier structure 004 on the base substrate 001 do not overlap.

By covering at least part of the second side face 005b of the adapting structure 005 with the first organic pattern 007, the risk of the second side face of the adapting structure 005 being eroded by moisture or oxygen can be reduced, thereby guaranteeing that the adapting structure 005 can effectively transmit power signals from the first power line 003. Moreover, the organic material for manufacturing the first organic pattern 007 is typically a hydrophilic material, therefore, by disposing the first overlapping region 00b as not overlapping the orthographic projection of the barrier structure 004 on the base substrate, i.e., making the first organic pattern 007 be spaced apart from the barrier structure 004, the moisture brought in by the end 003a of the first power line 003 for receiving power signals can be prevented from being introduced into the pixel units 002 through the barrier structure 004 and the first organic pattern 007, thereby guaranteeing the yield of the display substrate.

In summary, the embodiments of the present disclosure provide a display substrate, which includes a base substrate, a plurality of pixel units, at least one first power line, a barrier structure, an adapting structure, a cathode layer and a first organic pattern. By covering at least part of the second side face of the adapting structure with the first organic pattern, the risk of the second side face of the adapting structure being eroded by moisture or oxygen due to the etching defects can be reduced, thereby guaranteeing that the adapting structure can effectively transmit power signals from the first power line. Moreover, as the first organic pattern is spaced apart from the barrier structure, the moisture brought in by the end of the first power line for receiving power signals can be prevented from being introduced into the pixel units through the barrier structure and the first organic pattern, thereby guaranteeing the yield of the display substrate, as well as the display effect of the display substrate.

It should be noted that in the embodiments of the present disclosure, the region where the orthographic projections of the plurality of pixel units 002 on the base substrate 001 are located may be an active area (AA), also known as a display region or an AA region, of the display substrate. Therefore, the barrier structure 004 can be disposed as surrounding the AA region. The cathode layer 006 may be formed as a whole layer to cover the AA region.

Optionally, in the embodiments of the present disclosure, the orthographic projection of the cathode layer 006 on the base substrate 001 may cover the orthographic projections of the plurality of pixel units on the base substrate 001; and the orthographic projection of the cathode layer 006 on the base substrate 001 may be located within the orthographic projection of the region surrounded by the barrier structure 004 on the base substrate 001.

Optionally, in the embodiments of the present disclosure, a distance d between the first overlapping region 00b, where the orthographic projection of the first organic pattern 007 on the base substrate 001 and the orthographic projection of the at least one first power line 003 on the base substrate 001 overlap, and the orthographic projection of the barrier structure 004 on the base substrate 001 may be greater than a distance threshold. Among them, the distance threshold may be in a range from 80 microns ($\mu$m) to 150 $\mu$m. For example, the distance threshold may be 90 $\mu$m, 100 $\mu$m, 110 $\mu$m, 120 $\mu$m, 130 $\mu$m, 140 $\mu$m, etc. That is, a certain distance is present between the first organic pattern 007 and the barrier structure 004. As such, the first organic pattern 007 can be prevented from directly contacting the barrier structure 004 near the first line incoming port 00a of the first power line 003, and the moisture can be further prevented from being introduced into the pixel units 002 via the first organic pattern 007, thereby guaranteeing the encapsulation effect. Among them, the distance threshold may be a threshold that is determined through experiments in advance as being able to prevent the moisture from entering the pixel units 002. That is, when the distance between the first overlapping region 00b and the barrier structure 004 is greater than the distance threshold, it is hard for the moisture to enter the pixel units 002 in the display substrate.

Optionally, referring to FIG. 1, the end 003a of the at least one first power line 003 may be located in the middle portion on the side of the barrier structure 004 distal from the plurality of pixel units 002, for example, in the middle portion of the bonding region 00c.

Among them, the middle portion may be a region where a longitudinal axis X of the base substrate is located, and the longitudinal axis X is an axis parallel to the data lines on the base substrate 001. A distance between the longitudinal axis X and one side edge of the display substrate may be substantially equal to a distance between the longitudinal axis X and the other side edge of the display substrate. Both of the above-mentioned side edges are substantially parallel to an extension direction of the data line. Exemplarily, the extension direction of the data line and either of the two side edges, which are substantially parallel to the extension direction of the data lines in the display substrate, may have an included angle ranging from 0 degree to 10 degrees.

It should be noted that, the term "substantially" in the embodiments of the present disclosure may indicate that an error range within 15% may be allowed. For example, by "substantially" equal distances, it may mean that a deviation between two distances may not exceed 15%; by "substantially parallel" extension directions, it may mean that an included angle between two extension directions ranges from 0 degree to 30 degrees, for example, from 0 degree to 10 degrees, from 0 degree to 15 degrees, etc.; by "substantially" same shapes, it may mean that two shapes are of the same type, such as a rectangular shape, a polyline shape, an arc shape, a strip shape, an "L"-shaped, etc.; and by "substantially" same areas, it may mean that a deviation between two areas may not exceed 15%.

Exemplarily, referring to FIG. 1, the display substrate may include two first power lines 003. The two first power lines 003 may be adjacently arranged in the middle portion on the side of the barrier structure 004 distal from the plurality of pixel units 002. Or, the two first power lines 003 may also be spaced apart and symmetrically arranged with respect to the longitudinal axis X of the base substrate in the middle portion on the side of the barrier structure 004 distal from the plurality of pixel units 002. The positions for arranging the first power lines 003 are not limited in the embodiments of the present disclosure.

When the two first power lines 003 are adjacently arranged in the middle portion on the side of the barrier structure 004 distal from the plurality of pixel units 002, the two first power lines 003 may be formed to be an integral structure.

Exemplarily, when the two first power lines 003 are formed as an integral structure, that is, when there is one first power line 003, one end 003a of the first power line 003 is located in the middle portion on the side of the barrier structure 004 distal from the plurality of pixel units 002, for example, located in the middle portion of the bonding region 00c; and the distance from the end 003a of the first power line 003 to the longitudinal axis X may be less than the distance from the end 003a of the first power line 003 to each of the two side edges, that are substantially parallel to the longitudinal axis X, of the display substrate.

It should be noted that when the display substrate provided by an embodiment of the present disclosure is a foldable panel, a folding line of the foldable panel may be perpendicular to the longitudinal axis X. For example, the folding line of the foldable panel may be a perpendicular bisector of the longitudinal axis X.

Referring to FIG. 1 again, the display substrate may further include: at least one second power line 008. The at least one second power line 008 may include a first portion 0081 and a second portion 0082. The first portion 0081 may be located on the side of the barrier structure 004 distal from the plurality of pixel units 002, and is configured for receiving power signals. For example, the first portion 0081 may be connected to a driving chip and configured for receiving power signals provided by the driving chip. The second portion 0082 may be connected to the cathode layer 006 through the adapting structure 005.

Figure 3:
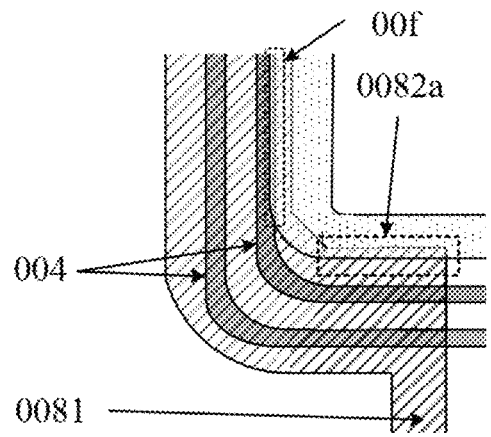
FIG. 3 is a schematic partial structural diagram of the display substrate shown in FIG. 1.

FIG. 3 is a schematic partial structural diagram of the display substrate shown in FIG. 1. Referring to FIGS. 1 and 3, the second portion 0082 may include a first junction 0082a and a second junction 0082b which are both connected to the adapting structure 005; and a distance between the first junction 0082a and the barrier structure 004 may be greater than a distance between the second junction 0082b and the barrier structure 004. That is, the first junction 0082a of the second portion 0082 of the at least one second power line 008 is not in contact with the barrier structure 004. In an example, the orthographic projection of the first junction 0082a on the base substrate 001 and the orthographic projection of the barrier structure 004 on the base substrate 001 do not overlap; and the second junction 0082b may be located within a region covered by the barrier structure 004, for example, the second junction 0082b may be in contact with the barrier structure 004.

Optionally, as shown in FIG. 1, the display substrate may further have a bonding region 00c, which may be located at a side of the barrier structure 004 distal from the plurality of pixel units 002. The first junction 0082a is closer to the bonding region 00c than the second junction 0082b. Among them, being closer means that the shortest distance between each point of the first junction 0082a and the bonding region 00c is greater than the shortest distance between each point of the second junction 0082b and the bonding region 00c.

Among them, each of the first junction 0082a and the second junction 0082b may refer to: a portion of the second portion 0082 of the second power line 008 which is in contact with the adapting structure 005. In the embodiments of the present disclosure, the junction may refer to a portion of the second portion 0082 which is in direct contact with the adapting structure 005. The shapes of the two junctions may be substantially the same as the shape of the region where the orthographic projection of the second portion 0082 on the base substrate and the orthographic projection of the adapting structure 005 on the base substrate overlap.

In an embodiment of the present disclosure, the second power line 008 may include two first portions 0081. The two first portions 0081 may be substantially symmetrically disposed, with respect to the longitudinal axis X of the base substrate 001, around an edge of a side of the barrier structure 004 distal from the plurality of pixel units 002.

In an embodiment of the present disclosure, the second power line 008 may include two first portions 0081. For example, the two first portions 0081 may be located on two sides of the longitudinal axis X respectively, such as at two sides of the bonding region 00c.

In an embodiment of the present disclosure, the second power line 008 may include two first portions 0081. For example, the part of the two first portions 0081 which are near the second line incoming port 00d are located at both sides of the display substrate, for another example, respectively proximal to two side edges that are parallel to the longitudinal axis X. Among them, the second line incoming port 00d may be a portion of the barrier structure 004 for a allowing the second power line 008 to pass through.

In the embodiments of the present disclosure, the power signals may be provided to the cathode layer 006 in the display substrate simultaneously through the first power line 003 in the middle portion and the second power line 008 at the edge portion, which can further alleviate the problem that a potential difference of the power signals loaded to the cathode layer 006 in different regions is large due to voltage drop. The cathode layer 006 has good long range uniformity (LRU) and good display effect.

In the embodiments of the present disclosure, both the first power line 003 located in the middle portion and the second power line 008 located at the edge portion may provide power signals to the cathode layer 006 in the display substrate. Meanwhile, even if the number of the first power line 003 in the middle portion is increased, the design of the first power line 003 in the embodiments of the present disclosure can favorably mitigate the moisture and oxygen erosions, and guarantee a good packaging performance.

It should be noted that, for a display substrate with a large size, more first power lines 003 may be provided. By providing power signals to the cathode layer 006 through more first power lines 003, the potential uniformity of different areas of the cathode layer 006 can be guaranteed, and the display substrate can achieve a better display effect.

It should also be noted that, in the embodiments of the present disclosure, as both the first power line 003 and the second power line 008 are configured to provide power signals for the cathode layer 006, the first power line 003 and the second power line 008 may also be referred to as a VSS power line or a VSS trace.

Figure 4:
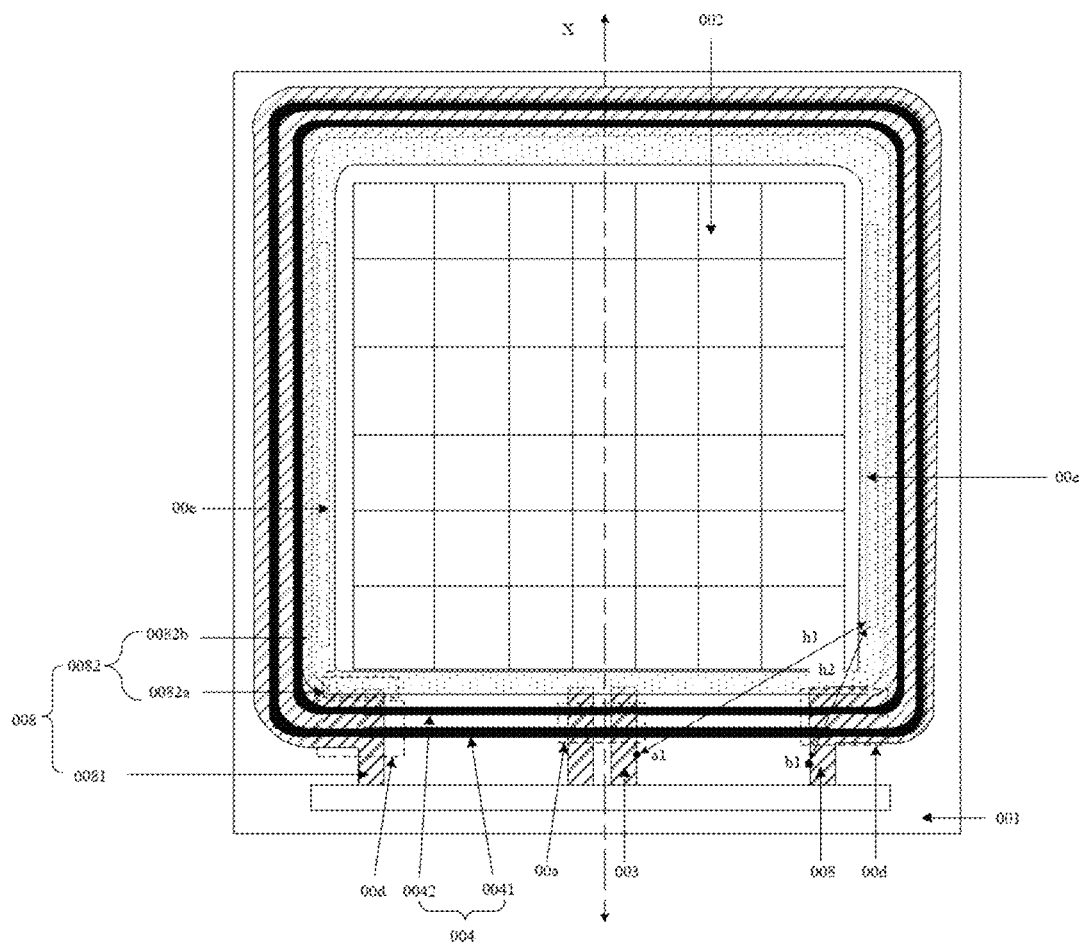
FIG. 4 is a schematic structural diagram of another display substrate according to an embodiment of the present disclosure.

FIG. 4 is a schematic structural diagram of another display substrate according to an embodiment of the present disclosure. As can be seen with reference to FIG. 4, the display substrate may further have: a row driving region 00e between the plurality of pixel units 002 and the barrier structure 004. A distance between the orthographic projection of the at least one first power line 003 on the base substrate and the row driving region 00e may be greater than a distance between an orthographic projection of the at least one second power line 008 on the base substrate and the row driving region 00e. For example, the distance between the at least one first power line 003 located in the middle portion and the row driving region 00e may be longer than the distance between the at least one second power line 008 and the row driving region 00e.

Or, it can be understood that, the shortest distance between each point on each first power line 003 and the row driving area 00e is greater than the shortest distance between each point on any second power line 008 and the row driving region 00e. For example, referring to FIG. 4, the distance h1 between the point a1 on the at least one first power line 003 and the row driving region 00e is greater than a distance h2 between the point b1 on the at least one second power line 008 and the row driving region 00e.

Among them, the row driving region 00e may be provided with a plurality of cascaded shift register units, which may be configured to drive each row of the pixel units 002.

Exemplarily, as shown in FIG. 4, the display substrate may have two row driving regions 00e, which may be symmetrically disposed on two sides of the plurality of pixel units 002 with respect to the longitudinal axis X of the base substrate 001.

Figure 5:
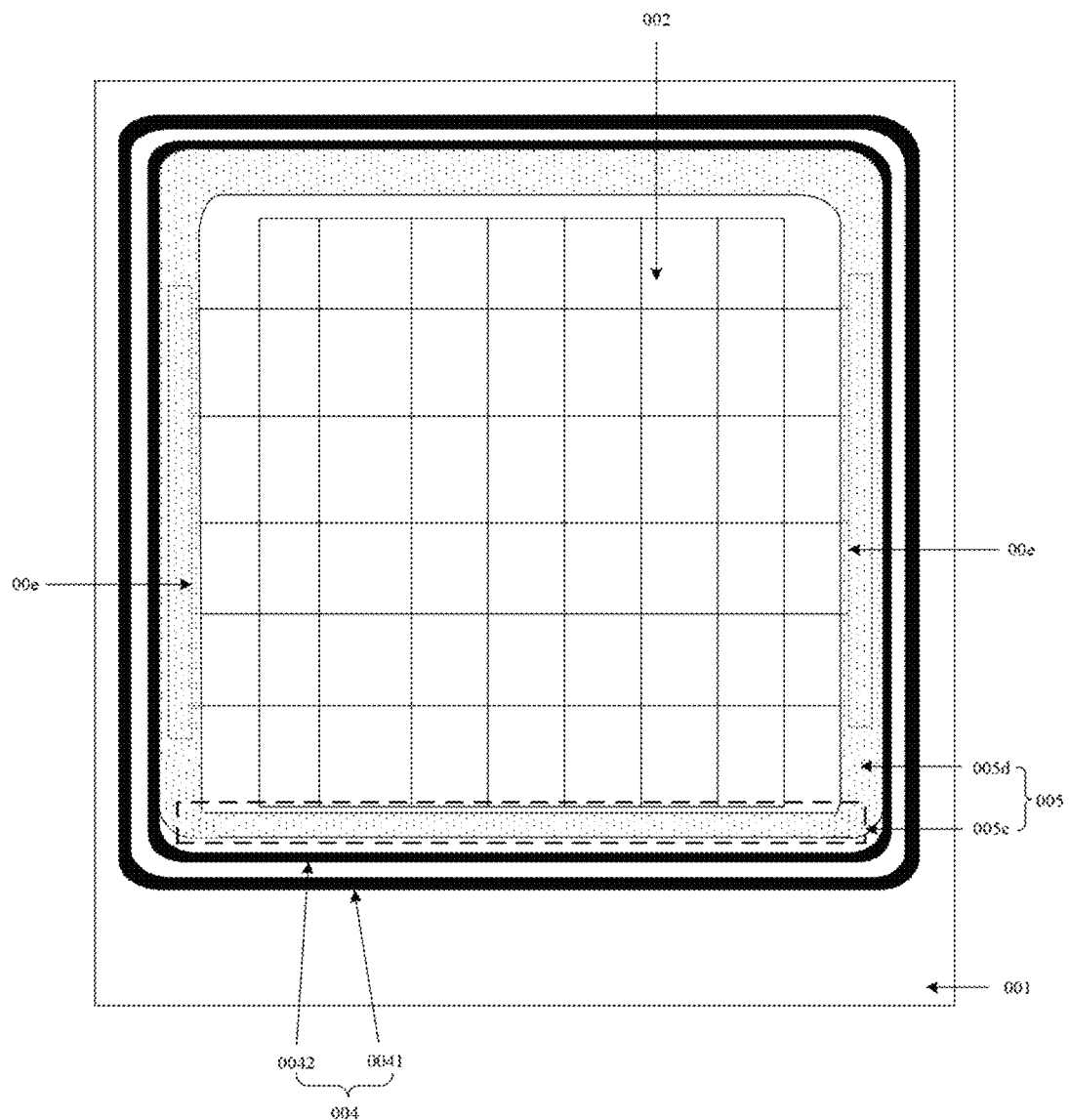
FIG. 5 is a schematic structural diagram of yet another display substrate according to an embodiment of the present disclosure.
Figure 6:
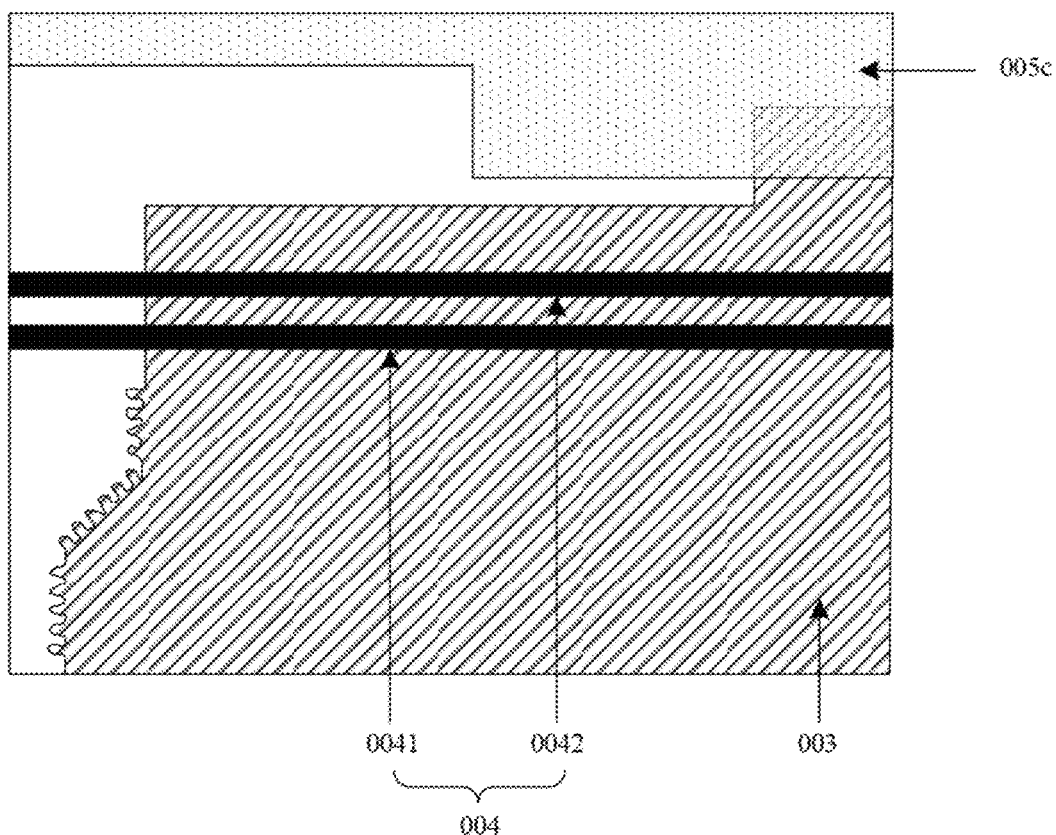
FIG. 6 is a schematic partial structural diagram of a display substrate according to an embodiment of the present disclosure.

FIG. 5 is a schematic structural diagram of yet another display substrate according to an embodiment of the present disclosure. FIG. 6 is a schematic partial structural diagram of a display substrate according to an embodiment of the present disclosure. As can be seen with reference to FIGS. 3, 5 and 6, the orthographic projection of the adapting structure 005 on the base substrate 001 may include a first projection region 005c and a second projection region 005d. As can be seen with reference to FIG. 1, the first projection region 005c is closer to the end 003a of the at least one first power line 003 for receiving power signals, relative to the second projection region 005d. The first projection region 005c and the orthographic projection of the barrier structure 004 on the base substrate 001 do not overlap; and the second projection region 005d and the orthographic projection of the barrier structure 004 on the base substrate 001 overlap at the second overlapping regions 00f. To clearly demonstrate the position relationship between the adapting structure 005 and the barrier structure, the first power line 003, the second power line 008 and the cathode layer 006 are not shown in FIG. 5.

The organic material for manufacturing the first organic pattern 007 is typically a hydrophilic material, therefore, by arranging the first projection region 005c in the orthographic projection of the adapting structure 005 on the base substrate 001 as not overlapping the orthographic projection of the barrier structure 004 on the base substrate 001, the first organic pattern 007 can be arranged as not in contact with the barrier structure 004 when the first organic pattern 007 covers, at the first projection region 005c, the second side face 005b of the adapting structure 005. That is, by arranging the first organic pattern 007 and the barrier structure 004 spaced apart, the moisture brought in by the end 003a of the first power line 003 for receiving power signals can be avoided from being introduced into the pixel units 002 through the barrier structure 004 and the first organic pattern 007, thereby guaranteeing the yield of the display substrate.

Optionally, the width of a lap joint between the adapting structure 005 and the first power line 003 may be wide, so as to guarantee that the contact resistance between the adapting structure 005 and the first power line 003 is as small as possible. Among them, referring to FIG. 6, the orthographic projection of the lap joint on the base substrate is an area where the first projection region 005c and the orthographic projection of the first power line 003 on the base substrate 001 overlap. The width of the portion of the adapting structure 005 distal from the lap joint may be narrow, so as to reduce the capacitive coupling effect on other signal lines provided on the side of the adapting structure 005 proximal to the base substrate. For example, the capacitive coupling effect on the data lines can be reduced.

With reference to FIGS. 1, 4 and 5, the second side face 005b of the adapting structure 005 may also be covered by the barrier structure 004. That is, the second side face 005b of the adapting structure 005 in the second projection region 005d may be covered by the barrier structure 004.

By covering the second side face 005b of the adapting structure 005 with the barrier structure 004, the area of the base substrate 001 occupied by the adapting structure 005 and the barrier structure 004 can be reduced, facilitating the realization of a narrow-frame display substrate. Moreover, the second projection region 005d of the adapting structure 005 has a longer distance from the first portion 0081 of the at least one second power line 008, is relatively far from the position of the second line incoming port 00d and thus a long entrance path is formed for the moisture. Therefore, even if the second side face 005b of the adapting structure 005 is covered by the barrier structure 004, the moisture cannot enter the pixel units 002.

Referring to FIGS. 1, 4 and 5, the adapting structure 005 may be in a ring structure surrounding the plurality of pixel units 002, so as to facilitate the cathode layer 006 to be connected to at least one first power line 003 through the adapting structure 005, thereby guaranteeing the potential uniformity of the power signals provided to the pixel units 002 of the display substrate, and achieving a good display effect.

Figure 7:
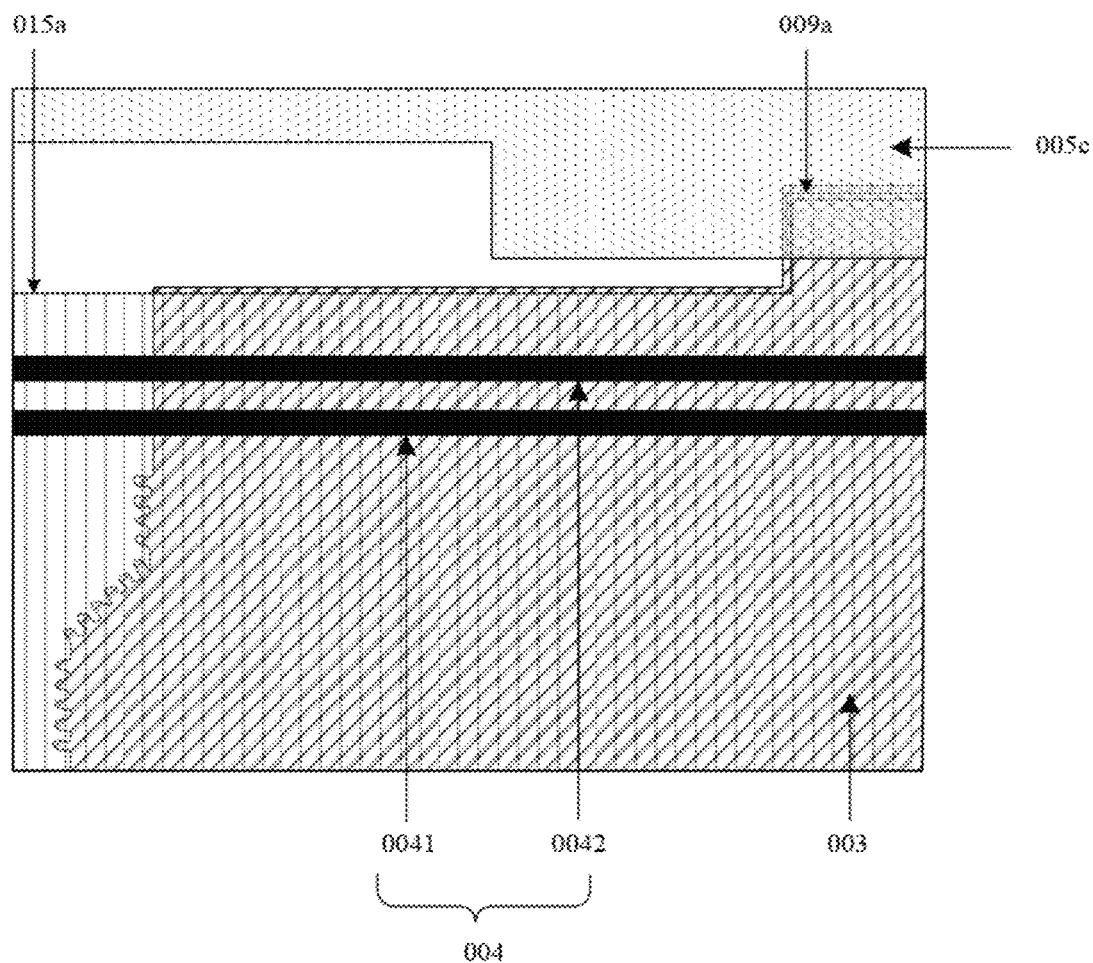
FIG. 7 is a schematic partial structural diagram of another display substrate according to an embodiment of the present disclosure.

In an embodiment of the present disclosure, referring to FIG. 2, the display substrate may further include: a passivation layer 009, which may cover at least one first power line 003. FIG. 7 is a schematic partial structural diagram of another display substrate according to an embodiment of the present disclosure. Referring to FIGS. 2 and 7, the passivation layer 009 is further provided with an opening 009a; the adapting structure 005 may be connected to the at least one first power line 003 through the opening 009a at a side proximal to the base substrate 001; and the adapting structure 005 may be connected to the cathode layer 006 at a side distal from the base substrate 001. Among them, 009a shown in FIG. 7 is an opening provided in the passivation layer 009. That is, in FIG. 7, except for the region where the opening 009a is located, the remaining regions are all covered with the passivation layer 009.

During the preparation of the display substrate, the at least one first power line 003 is easy to be eroded by moister or oxygen. Therefore, by covering at least one first power line 003 with the passivation layer 009, it can be guaranteed that when other film layers are formed, the at least one first power line 003 would not be eroded by the moisture or oxygen, thereby guaranteeing that the at least one first power line 003 can provide power signals to the cathode layer 006, and ensuring the display effect of the display substrate.

In the embodiments of the present disclosure, the opening in the passivation layer 009 may be a via hole or may be a slot, which is not limited in the embodiments of the present disclosure. The material for manufacturing the passivation layer 009 may include: one or more inorganic oxides such as SiNx (silicon nitride), SiOx (silicon oxide) and SiOxNy (silicon oxynitride). The material for manufacturing the passivation layer 009 is not limited in the embodiments of the present disclosure.

It should be noted that, in an embodiment of the present disclosure, the passivation layer 009 may also cover the at least one second power line 008, thereby guaranteeing that the at least one second power line 008 would not be eroded by moisture or oxygen, and ensuring the display effect of the display substrate.

In an embodiment of the present disclosure, referring to FIGS. 1, 4 and 5, the barrier structure 004 may be in a ring structure surrounding the plurality of pixel units 002 for blocking the overflow of an organic layer of the display substrate located within the region surrounded by the barrier structure 004. With reference to FIGS. 1 to 7, the barrier structure 004 may include: a first barrier dam 0041 and a second barrier dam 0042. The first barrier dam 0041 is farther from the plurality of pixel units 002 relative to the second barrier dam 0042, and the thickness of the first barrier dam 0041 may be greater than the thickness of the second barrier dam 0042.

By arranging the two barrier dams, wherein the thickness of the first barrier dam 0041 distal from the plurality of pixel units 002 is greater than the thickness of the second barrier dam 0042 proximal to the plurality of pixel units 002, the overflow of the organic layer within the region surrounded by the barrier structure 004 can be further prevented. Of course, the barrier structure 004 may further include one barrier dam, or more than two barrier dams, which is not limited in the embodiments of the present disclosure.

Figure 8:
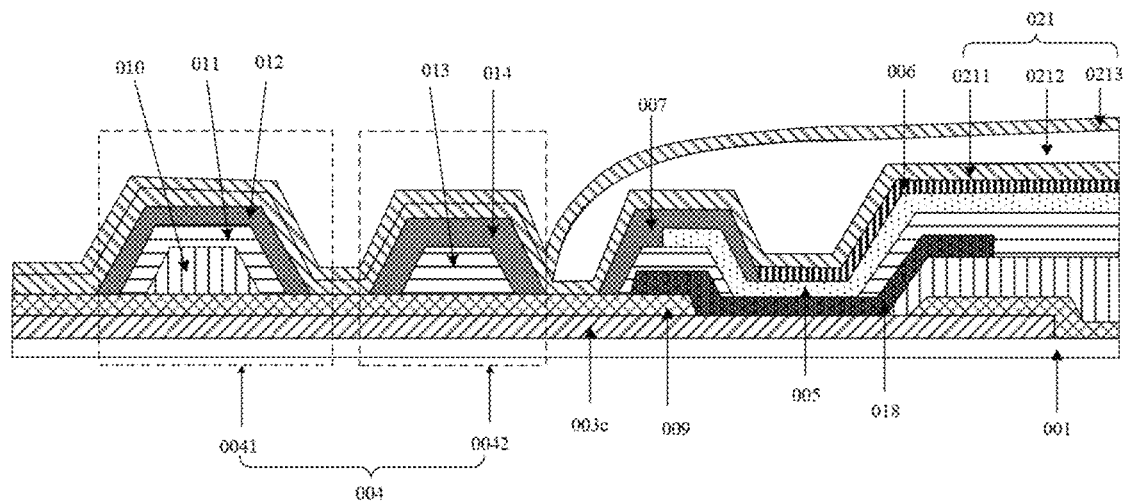
FIG. 8 is a schematic structural diagram of still another display substrate according to an embodiment of the present disclosure.

As an optional implementation, FIG. 8 is a schematic structural diagram of still another display substrate according to an embodiment of the present disclosure. As can be seen by referring to FIG. 8, the first barrier dam 0041 may include: a first planarization layer pattern 010, a second planarization layer pattern 011, and a second organic pattern 012 which are disposed along a direction away from the base substrate 001. The second barrier dam 0042 may include: a third planarization layer pattern 013 and a third organic pattern 014 which are disposed along a direction away from the base substrate 001.

Among them, the second planarization layer pattern 011 and the third planarization layer pattern 013 may include the same material; and the first organic pattern 007, the second organic pattern 012 and the third organic pattern 014 may include the same material. For example, the second planarization layer pattern 011 and the third planarization layer pattern 013 may employ the same material and may be prepared from the same patterning process; and the first organic pattern 007, the second organic pattern 012 and the third organic pattern 014 may employ the same material, and may be prepared from the same patterning process.

In an embodiment of the present disclosure, the first planarization layer pattern 010 may belong to a first planarization layer; the second planarization layer pattern 011 and the third planarization layer pattern 013 may belong to a second planarization layer; and the first organic pattern 007, the second organic pattern 012 and the third organic pattern 014 may belong to a first organic layer, which may be a pixel definition layer (PDL).

Optionally, materials for manufacturing the first planarization layer, the second planarization layer, and the first organic layer may include: organic materials such as resins. This is not limited in the embodiments of the present disclosure.

As another optional implementation, referring to FIG. 2, the first barrier dam 0041 may include: a planarization layer pattern 015 and a second organic pattern 012 which are sequentially arranged in layers along a direction away from the base substrate 001. The second barrier dam 0042 may include: a third organic pattern 014 disposed on the base substrate 001.

Among them, the first organic pattern 007, the second organic pattern 012 and the third organic pattern 014 may include the same material. For example, the first organic pattern 007, the second organic pattern 012 and the third organic pattern 014 may employ the same material, and may be prepared from the same patterning process.

In an embodiment of the present disclosure, the planarization layer pattern 015 may belong to the planarization layer; and the first organic pattern 007, the second organic pattern 012, and the third organic pattern 014 may belong to the first organic layer.

Optionally, the materials for manufacturing the planarization layer may include: organic materials such as resins. This is not limited in the embodiments of the present disclosure.

It should be noted that the opening 015a shown in FIG. 7 is a region that is not covered by the planarization layer pattern 015. For example, in the region shown in FIG. 7, except for the region where the opening 015a is located, the remaining regions on the base substrate 001 are all covered with the planarization layer pattern 015. As can be seen from FIG. 7, the planarization layer pattern 015 may cover a boundary of a portion of the first power line 003 within the region surrounded by the barrier structure 004.

With reference to FIGS. 2 and 7, for a superimposing region between the orthographic projection of the at least one first power line 003 on the base substrate 001 and the first projection region 005c, the region, where the orthographic projection of the opening 009a of the passivation layer 009 on the base substrate 001 and the superimposing region overlap, may cover the region, where the orthographic projection of the opening 015a of the planarization layer pattern 015 on the base substrate 001 and the superimposing region overlap. That is, in this superimposing region, the size of the opening 009a of the passivation layer 009 is greater than the size of the opening 015a of the planarization layer pattern 015.

As can be seen by referring to FIGS. 2 and 8, the first barrier dam 0041 has one additional planarization layer pattern relative to the second barrier dam 0042, so that the thickness of the first barrier dam 0041 is greater than the thickness of the second barrier dam 0042, thereby preventing the overflow of the organic layer.

Figure 9:
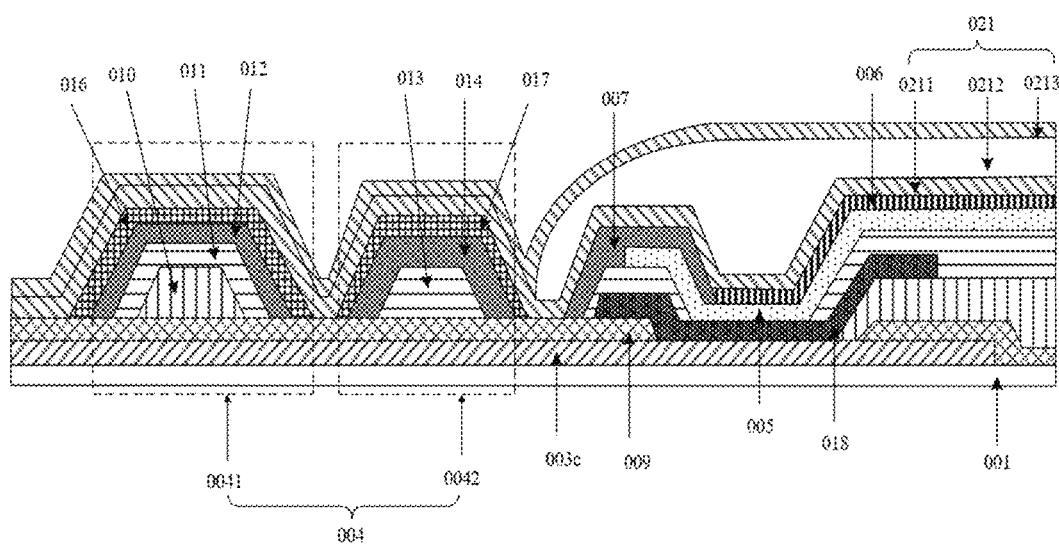
FIG. 9 is a schematic structural diagram of still another display substrate according to an embodiment of the present disclosure.

FIG. 9 is a schematic structural diagram of still another display substrate according to an embodiment of the present disclosure. As can be seen from FIG. 9, the first barrier dam 0041 may further include: a fourth organic pattern 016 disposed on a side of the second organic pattern 012 distal from the base substrate. The second barrier dam 0042 may include: a fifth organic pattern 017 disposed on a side of the third organic pattern 014 distal from the base substrate 001.

Among them, the fourth organic pattern 016 and the fifth organic pattern 017 may include the same material. For example, the fourth organic pattern 016 and the fifth organic pattern 017 may employ the same material, and may be prepared from the same patterning process. Moreover, both the fourth organic pattern 016 and the fifth organic pattern 017 may belong to a second organic layer, which may be a photo spacer (PS).

Optionally, the material for manufacturing the second organic layer may include: organic materials such as resins. This is not limited in the embodiments of the present disclosure.

Figure 10:
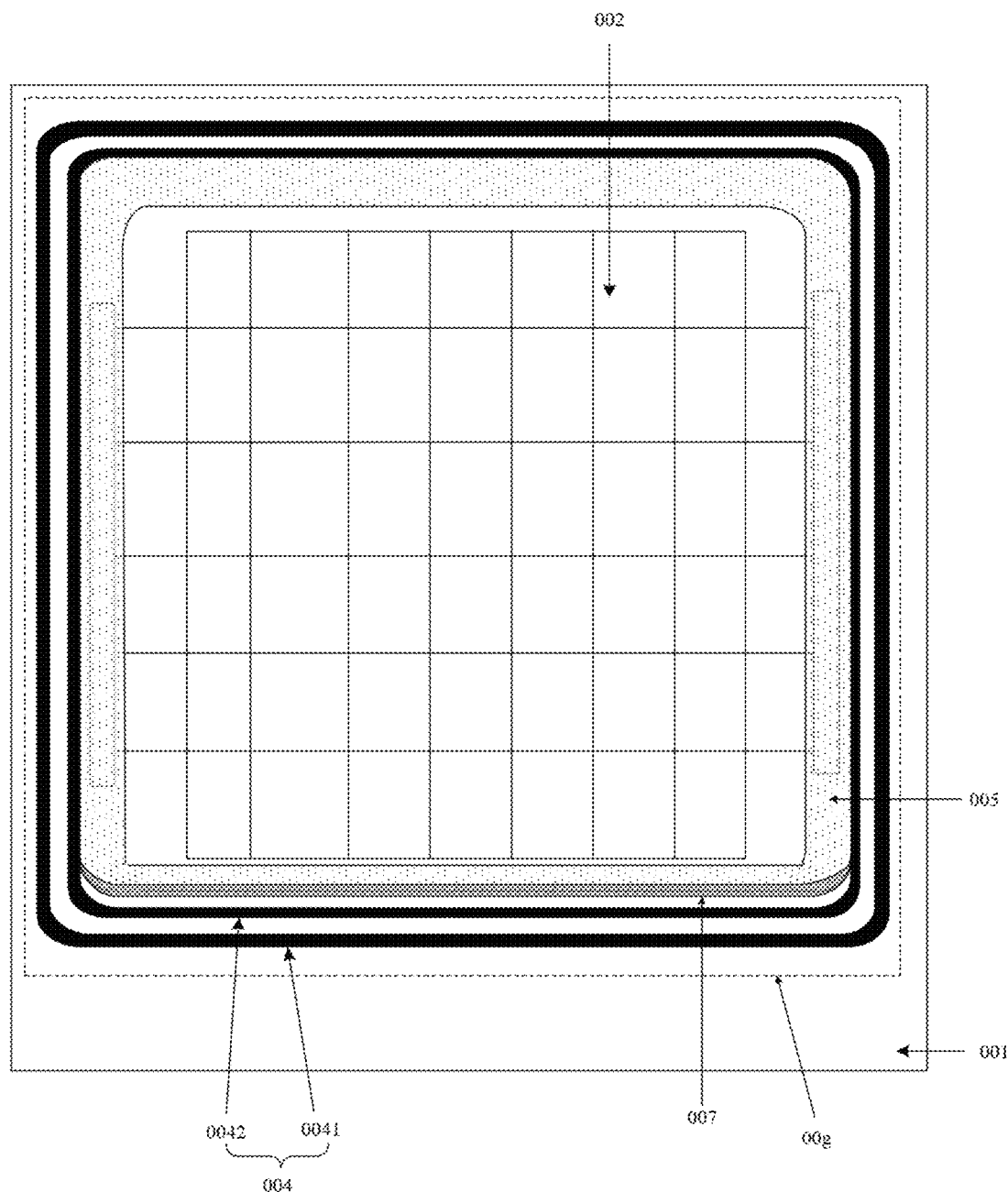
FIG. 10 is a schematic structural diagram of still another display substrate according to an embodiment of the present disclosure.

FIG. 10 is a schematic structural diagram of still another display substrate according to an embodiment of the present disclosure. As can be seen by referring to FIG. 10, the first organic pattern 007 may cover the second side face 005b of the adapting structure 005. Referring to FIGS. 1, 4, 5 and 10, the first barrier dam 0041 may be a first ring, and the second barrier dam 0042 may be a second ring. Partial patterns in the first organic pattern 007 and the third organic pattern 014 may define a third ring. An orthographic projection of the third ring on the base substrate 001 may be located within the orthographic projection of the second ring on the base substrate 001. The orthographic projection of the second ring on the base substrate 001 may be located within the orthographic projection of the first ring on the base substrate 001. Among them, the third ring may surround a plurality of pixel units 002. The shape of the third organic pattern 014 may be substantially the same as the shape of the second barrier dam 0042, that is, the third organic pattern 014 is also ring-shaped.

The partial patterns may be patterns of the third organic pattern 014 on the side of the first organic pattern 007 proximal to the plurality of pixel units 002. For example, referring to FIG. 10, the partial patterns may be patterns on the left, upper, and right sides of the third organic pattern 014.

Figure 11:
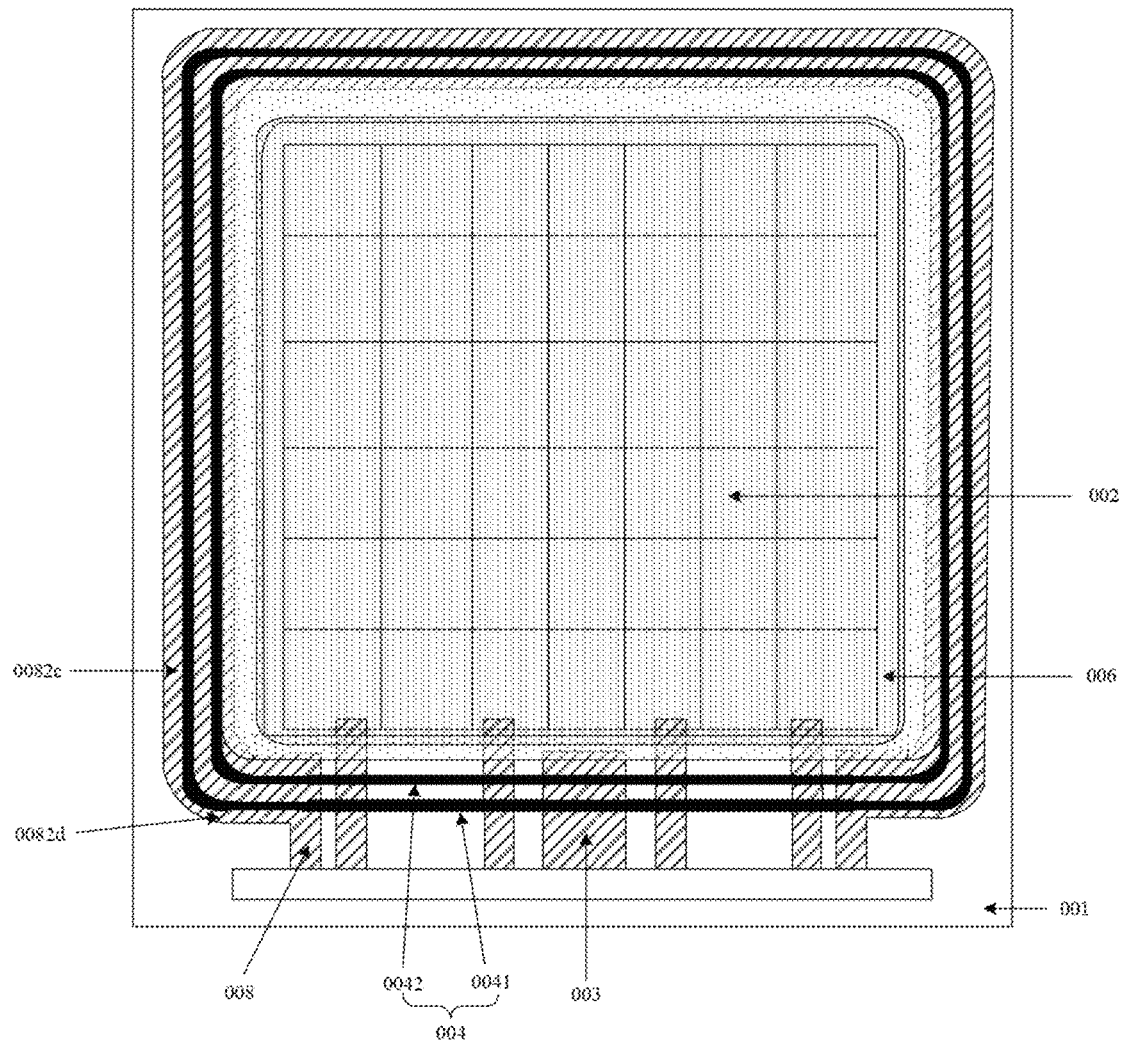
FIG. 11 is a schematic structural diagram of still another display substrate according to an embodiment of the present disclosure.

In an embodiment of the present disclosure, the first organic pattern 007 may include a portion which is in direct contact with the second barrier dam 0042. Referring to FIGS. 1, 4 and 11, the second power line 008 may include two first portions 0081 and one second portion 0082. The two first portions 0081 may be symmetrically disposed on two sides of the base substrate 001 with respect to the longitudinal axis X of the base substrate 001. For example, the part of the two first portions 0081 near the second line incoming port 00d may be located on two sides of the display substrate, and in another example, may be located close to one of the two side edges that are parallel to the longitudinal axis X. Among them, FIG. 4 shows the second line incoming ports 00d of the two first portions 0081. The second portions 0082 may surround the plurality of pixel units 002, and both ends of a second portion 0082 may be connected to one first portion 0081 respectively.

In an embodiment of the present disclosure, the first portion 0081 and the second portion 0082 may be in direct contact, for example, be formed as an integral structure.

In an embodiment of the present disclosure, the second power line 008 may include: a straight portion 0082c and an arc-shaped portion 0082d which surround a region where the plurality of pixel units 002 are located.

In an embodiment of the present disclosure, the second portion 0082 may include: a straight portion 0082c and an arc-shaped portion 0082d which surround the region where the plurality of pixel units 002 are located. Moreover, the second portion 0082 of the second power line 008 may have an non-enclosed structure. The embodiments of the present disclosure takes the second portion 0082 which at least surrounds two edges of the display substrate as an example.

An orthographic projection of a portion of the first organic pattern 007 which is in direct contact with the second barrier dam 0042 on the base substrate 001 can be located within an orthographic projection of the arc-shaped portion 0082d on the base substrate 001. That is, the orthographic projection of the portion of the first organic pattern 007 which is in direct contact with the second barrier dam 0042 on the base substrate 001 does not go outside of the orthographic projection of the arc-shaped portion 0082d on the base substrate 001.

In an embodiment of the present disclosure, the arc-shaped portion 0082d is closer to the first portion 0081 of at least one second power line 008 for receiving power signals relative to the straight portion 0082c.

As an optional implementation, referring to FIG. 8, the at least one first power line 003 may include: a first metal layer 003c. The display substrate may further include: an auxiliary metal layer 018 on a side of the first metal layer 003c distal from the base substrate 001.

In an embodiment of the present disclosure, the auxiliary metal layer 018 may be in contact with the adapting structure 005 at the side distal from the first metal layer 003c, and an orthographic projection of the auxiliary metal layer 018 on the base substrate 001 and the orthographic projection of the barrier structure 004 on the base substrate 001 may not overlap. For example, the orthographic projection of the auxiliary metal layer 018 on the base substrate 001 includes a portion which is within a region surrounded by the orthographic projection of the barrier structure 004 on the base substrate 001.

Figure 12:
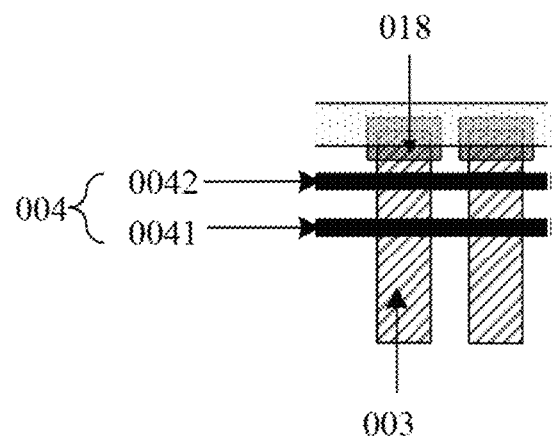
FIG. 12 is a schematic partial structural view of yet another display substrate according to an embodiment of the present disclosure.

FIG. 12 is a schematic partial structural diagram of still another display substrate according to an embodiment of the present disclosure. Referring to FIG. 12, the orthographic projection of the auxiliary metal layer 018 on the base substrate 001 includes a portion which is within a region surrounded by the orthographic projection of the second barrier dam 0042 on the base substrate 001.

In an embodiment of the present disclosure, the side of the first metal layer 003c distal from the base substrate 001 is not provided with the auxiliary metal layer 018 in the region where the barrier structure 004 is located. That is, the auxiliary metal layer 018 in the region where the barrier structure 004 is located is removed. That is, the auxiliary metal layer 018 in the region where the first line incoming port 00a is located is removed. For example, the side of the barrier structure 004 distal from the plurality of pixel units 002 may be provided with an auxiliary metal layer 018; and the region surrounded by the barrier structure 004 may also be provided with a auxiliary metal layer 018.

The shape of a boundary of the auxiliary metal layer 018 may be substantially the same as the shape of a boundary of the first metal layer 003c, or the shape of the boundary of the auxiliary metal layer 018 may also be different from the shape of the boundary of the first metal layer 003c. This is not limited in the embodiments of the present disclosure.

Among them, the power signals received by the first metal layer 003c may be transmitted to the adapting structure 005 through the auxiliary metal layer 018 disposed in the opening of the passivation layer 009. The power signals are transmitted to the cathode layer 006 through the adapting structure 005.

In an embodiment of the present disclosure, referring to FIG. 8, the side of the auxiliary metal layer 018 distal from the base substrate 001 may be covered, at portions close to the edges and at the side edges, by a second planarization layer including a second planarization layer pattern 011 and a third planarization layer pattern 013; and the second planarization layer may be configured to avoid display defects caused by etching defects on the sidewalls of the auxiliary metal layer 018.

The organic material for manufacturing the second planarization layer is typically a hydrophilic material, therefore, to prevent the auxiliary metal layer 018 from introducing moisture into the pixel units 002, the orthographic projection of the auxiliary metal layer 018 on the base substrate 001 and the orthographic projection of the barrier structure 004 on the base substrate 001 can be disposed as not overlapping, such that the moisture can be blocked from entering, via the barrier structure, the region where the pixel units 002 are located along the path of the second planarization layer, thereby guaranteeing the display effect of the display substrate.

Figure 13:
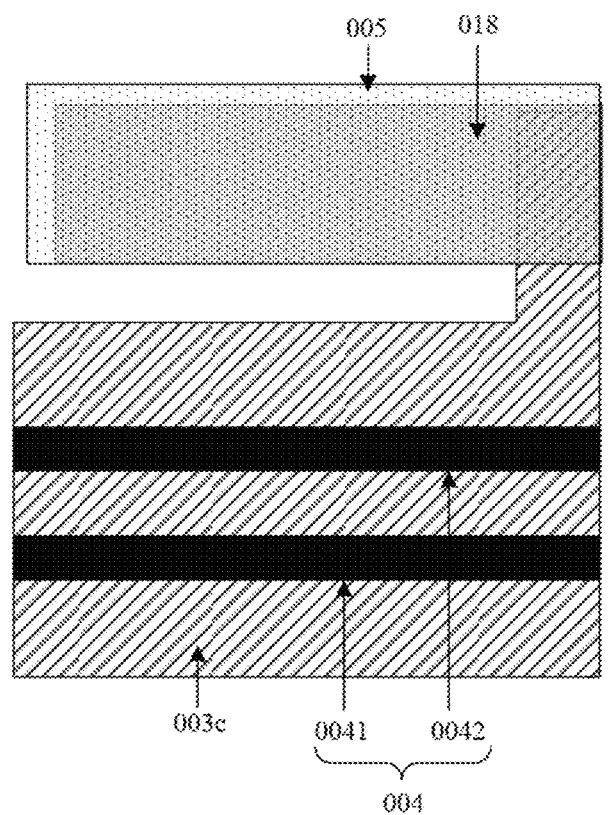
FIG. 13 is a schematic partial structural diagram of still another display substrate according to an embodiment of the present disclosure.
Figure 14:
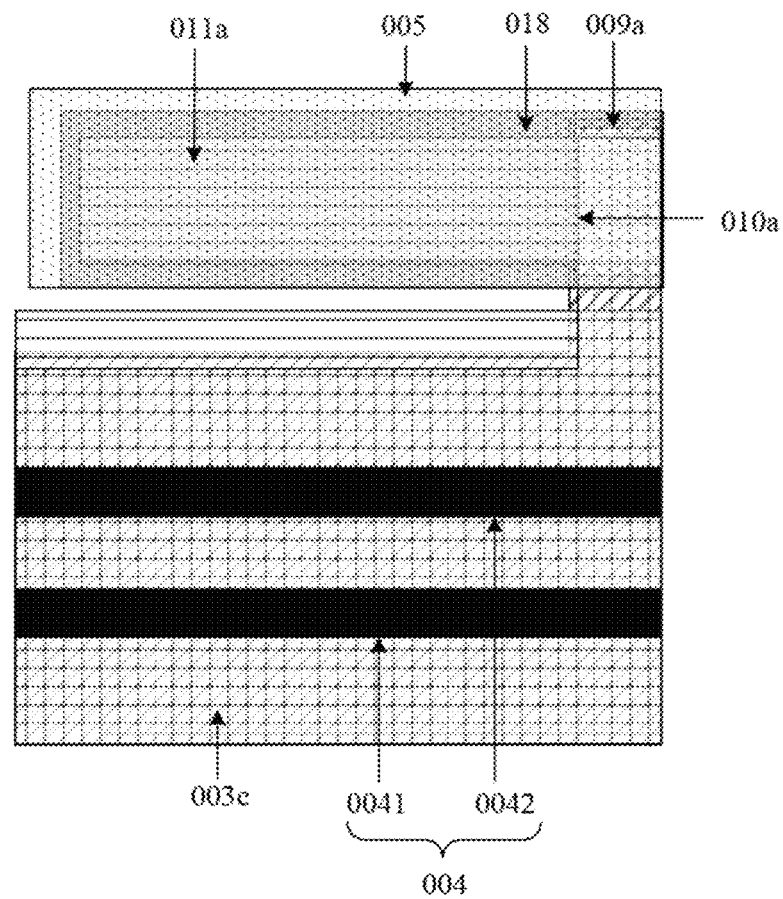
FIG. 14 is a schematic partial structural diagram of still another display substrate according to an embodiment of the present disclosure.

FIG. 13 is a schematic partial structural view of yet another display substrate according to an embodiment of the present disclosure. As can be seen by referring to FIG. 13, the orthographic projection of a portion of the auxiliary metal layer 018 in contact with the first metal layer 003c, on the base substrate 001, may be located within the orthographic projection of the auxiliary metal layer 018 on the base substrate 001, so that a distance is present between the boundary of the first metal layer 003c and the boundary of the auxiliary metal layer 018. Thus, the first metal layer 003c and the auxiliary metal layer 018 can be prevented from being eroded by the moisture or oxygen. FIG. 13 is a schematic partial structural diagram of still another display substrate according to an embodiment of the present disclosure. 010a shown in FIG. 14 is an opening provided in the first planarization layer. That is, in FIG. 14, except for the region where the opening 010a is located, the remaining regions are all covered with the first planarization layer. 011a shown in FIG. 14 is an opening provided in the second planarization layer. That is, in FIG. 14, except for the region where the opening 011a is located, the remaining regions are all covered with the second planarization layer.

In this implementation, the first metal layer 003c, the passivation layer 009, the first planarization layer pattern 010, the auxiliary metal layer 018, the second planarization layer pattern 011, and the first organic pattern 007 in the display substrate may be arranged in layers along a direction away from the base substrate 001. That is, the first power line 003, the passivation layer 009, the first planarization layer, the auxiliary metal layer 018, the second planarization layer, and the first organic layer in the display substrate may be disposed in layers along the direction of the base substrate 001.

It should be noted that both the first metal layer 003c and the auxiliary metal layer 018 may include three metal film layers. For example, the materials of the three metal film layers may sequentially be titanium (Ti), aluminum (Al), and Ti.

Figure 15:
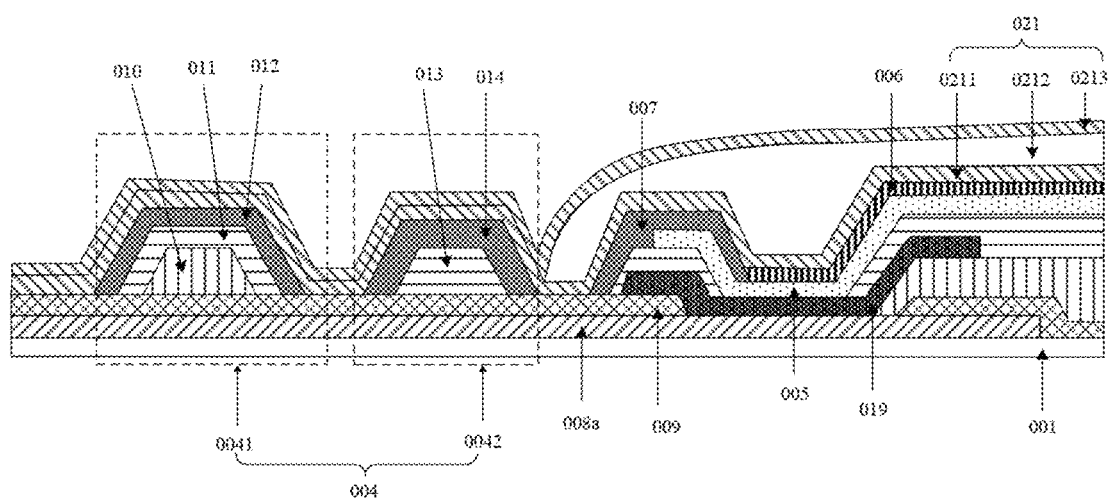
FIG. 15 is a sectional view of the display substrate shown in FIG. 1 taken along a direction of CC.

It should also be noted that FIG. 15 is a sectional view of the display substrate shown in FIG. 1 taken along a direction of CC. Referring to FIG. 15, the at least one second power line 008 may include: a second metal layer 008a. The display substrate may further include: an auxiliary trace layer 019 on a side of the second metal layer 008a distal from the base substrate 001.

In an embodiment of the present disclosure, the auxiliary trace layer 019 may be in contact with the adapting structure 005 at the side distal from the second power line 008, and an orthographic projection of the auxiliary trace layer 019 on the base substrate 001 and the orthographic projection of the barrier structure 004 on the base substrate 001 may overlap. For example, the orthographic projection of the auxiliary trace layer 019 on the base substrate 001 includes a portion within the orthographic projection of the barrier structure 004 on the base substrate 001.

Figure 16:
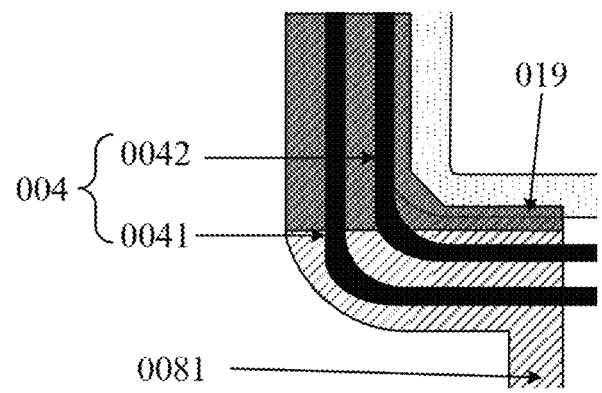
FIG. 16 is a schematic partial structural diagram of still another display substrate according to an embodiment of the present disclosure.

FIG. 16 is a schematic partial structural diagram of still another display substrate according to an embodiment of the present disclosure. Referring to FIG. 16, the orthographic projection of the auxiliary trace layer 019 on the base substrate 001 may have a portion which is within the orthographic projection of the second barrier dam 0042 on the base substrate 001.

In an embodiment of the present disclosure, the side of the second metal layer 008a distal from the base substrate 001 is not provided with the auxiliary trace layer 019 in the region where the barrier structure 004 is located. That is, the auxiliary trace layer 019 in the region where the barrier structure 004 is located is removed. That is, the auxiliary trace layer 019 in the region where the second line incoming port 00d is located is removed. For example, the side of the barrier structure 004 distal from the plurality of pixel units may be provided with the auxiliary trace layer 019; and the region included in the barrier structure 004 may be provided with the auxiliary trace layer 019.

The shape of a boundary of the auxiliary trace layer 019 may be substantially the same as the shape of a boundary of the second metal layer 008a, or the shape of the boundary of the auxiliary trace layer 019 may be different from the shape of the boundary of the second metal layer 008a. This is not limited in the embodiments of the present disclosure.

Figure 17:
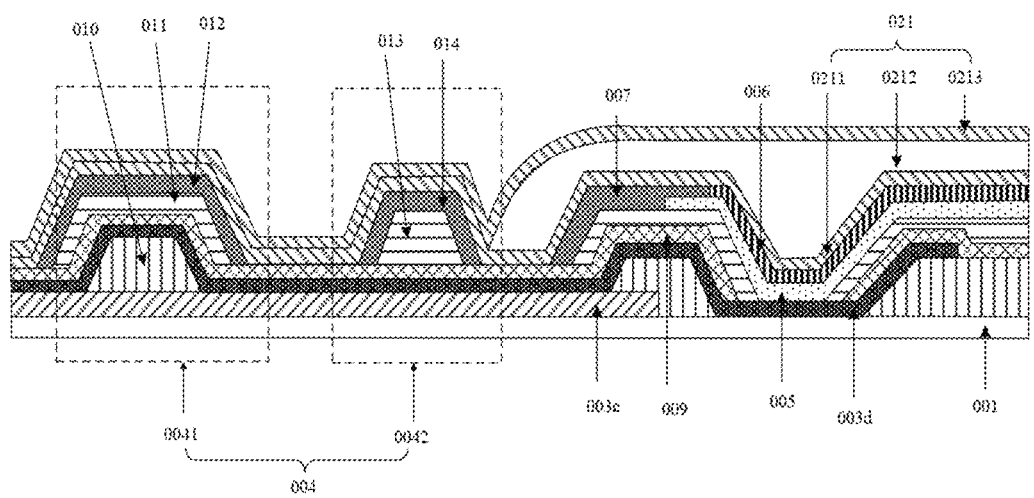
FIG. 17 is a schematic structural diagram of still another display substrate according to an embodiment of the present disclosure.

As another optional implementation, referring to FIG. 17, the at least one first power line 003 may include: a first metal layer 003c and a third metal layer 003d, which are disposed along a direction away from the base substrate 001. The third metal layer 003d is in contact with the adapting structure 005 at the side distal from the first metal layer 003c.

Both the orthographic projection of the first metal layer 003c on the base substrate 001 and the orthographic projection of the third metal layer 003d on the base substrate 001 may overlap the orthographic projection of the barrier structure 004 on the base substrate 001. That is, the ends of both the first metal layer 003c and the third metal layer 003d distal from the plurality of pixel units 002 can be configured to receive the power signals, so that the power signals can be transmitted to the cathode layer 006 through both the first metal layer 003c and the third metal layer 003d. Therefore, the resistance can be reduced to further reduce the voltage drop of the power signals.

Referring to FIG. 17, the orthographic projection of the first metal layer 003c on the base substrate 001 and the region where the third metal layer 003d is in contact with the adapting structure 005 do not overlap.

Figure 18:
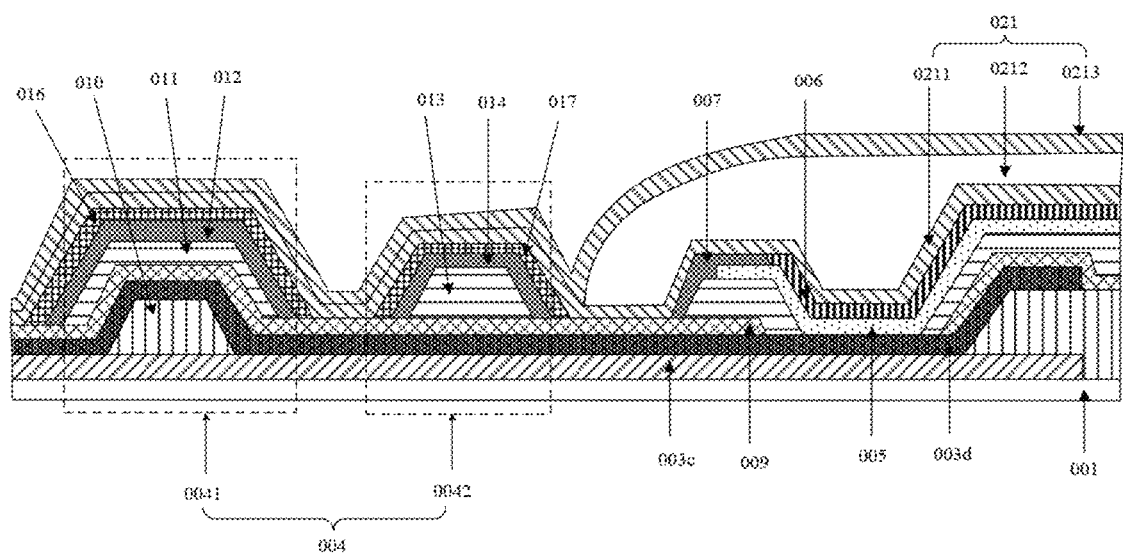
FIG. 18 is a schematic structural diagram of still another display substrate according to an embodiment of the present disclosure.

Or, referring to FIG. 18, the orthographic projection of the first metal layer 003c on the base substrate 001 may overlap the region where the third metal layer 003d is in contact with the adapting structure 005.

Among them, the first planarization layer may cover the other end of the first metal layer 003c proximal to the plurality of pixel units 002, to reduce the oxygen or moisture corrosions occurring to the other end of the first metal layer 003c, or to reduce the final display defects caused by the etching defects of the side faces of the metal layers.

As can be seen by referring to FIGS. 17 and 18, the first metal layer 003c, the first planarization layer pattern 010, the third metal layer 003d, the passivation layer 009, the second planarization layer pattern 011 and the first organic pattern 007 in the display substrate may be disposed in layers along a direction away from the base substrate 001. That is, the first metal layer pattern 003c, the first planarization layer, the third metal layer 003d, the passivation layer 009, the second planarization layer, and the first organic layer in the display substrate may be disposed in layers along the direction of the base substrate 001.

It should be noted that both the first metal layer 003c and the third metal layer 003d may include three metal film layers. For example, the materials of the three metal film layers may sequentially be Ti, Al, and Ti.

It should also be noted that, referring to FIGS. 9 and 18, when the first barrier dam 0041 further includes a fourth organic pattern 016 disposed on a side of the second organic pattern 012 distal from the base substrate, and the second barrier dam 0042 further includes a fifth organic pattern 017 disposed on a side of the third organic pattern 014 distal from the base substrate 001, the second organic layer including the fourth organic pattern 016 and the fifth organic pattern 017 may be disposed on a side of the first organic layer distal from the base substrate 001.

Figure 19:
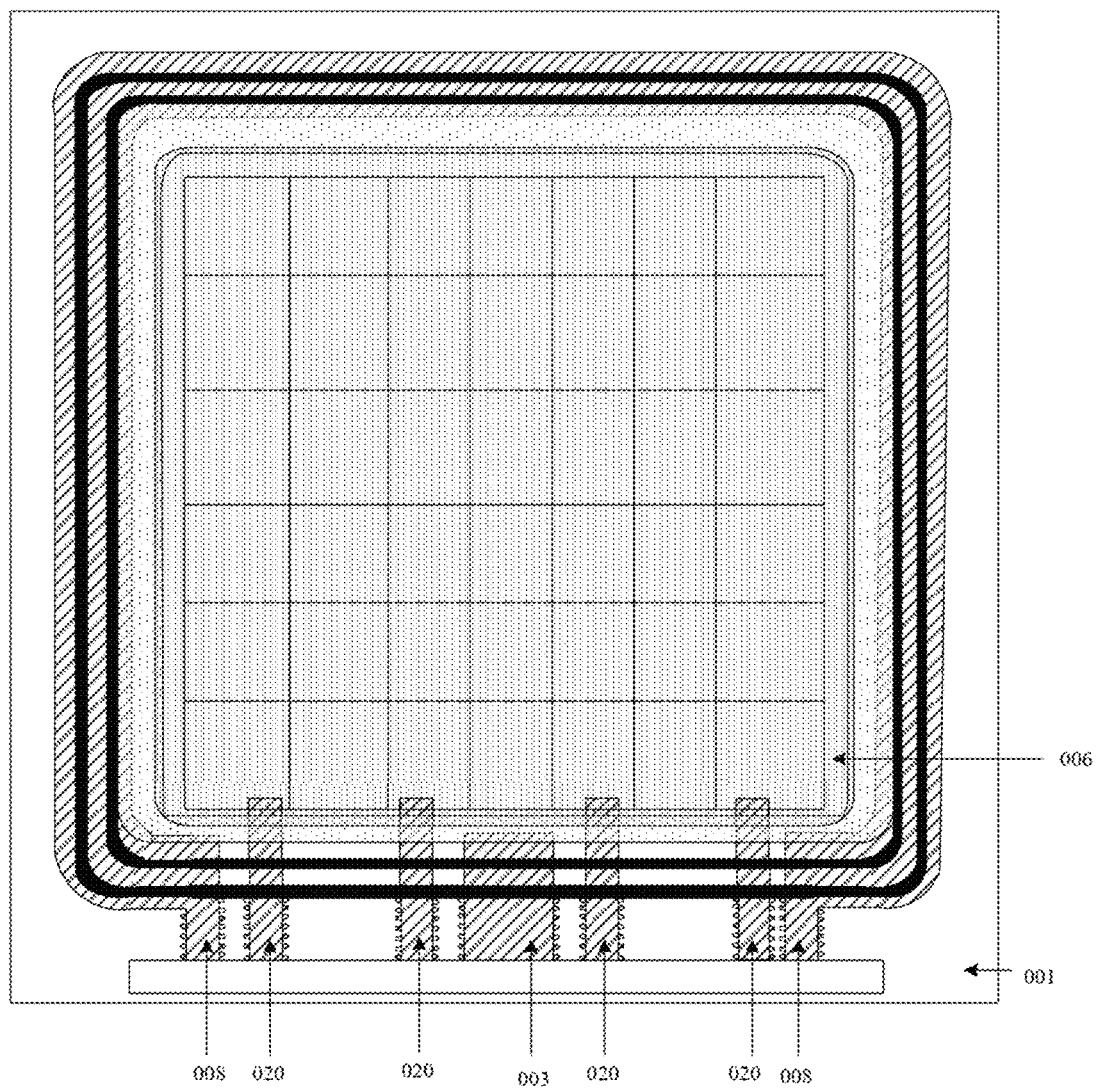
FIG. 19 is a schematic structural diagram of still another display substrate according to an embodiment of the present disclosure.

FIG. 19 is a schematic structural diagram of still another display substrate according to an embodiment of the present disclosure. As can be seen by referring to FIGS. 6 and 19, a plurality of tooth-shaped protruding structures are formed on a side face of the at least one first power line 003 at the end of the barrier structure 004 distal from the plurality of pixel units 002. Therefore, an entrance path of moisture can be further prolonged, and the moisture can be prevented from being introduced into the plurality of pixel units 002.

Referring to FIGS. 6 and 19, the orthographic projections of the protruding structures on the base substrate 001 and the orthographic projection of the barrier structure 004 on the base substrate 001 do not overlap. Moreover, a side face of the other end 003b of the at least one first power line 003 within the region surrounded by the barrier structure 004 may be flat. That is, no protruding structure is formed on the side face of the other end 003b of the at least one first power line 003 within the region surrounded by the barrier structure 004.

When the display substrate is prepared, the adapting structure 005 is prepared through sequential processes such as exposure, development and etching. In an etching process, an etchant needs to be used for etching a film layer. If the side face of the other end 003b of the first power line 003 within the region surrounded by the barrier structure 004 is also configured as having tooth-like protruding structures, the etchant will remain among the adjacent protruding structures of the first power line 003, so that the side wall of the other end 003b of the first power line 003 will be corroded. Therefore, by configuring the side face of the other end 003b of the first power line 003 within the region surrounded by the barrier structure 004 as a flat face, the passivation layer 009 which is a brittle film on the side of the first power line 003 distal from the base substrate 001 can be prevented from being penetrated through due to the corrosion on the side wall of the first power line 003 in the process of manufacturing the display substrate. Thus, the quality of the passivation layer 009 can be guaranteed.

As also can be seen by referring to FIG. 19, a plurality of tooth-shaped protruding structures may also be formed on a side face of an end of a first portion 0081 of the at least one second power line 008 distal from the plurality of pixel units 002. Therefore, an entrance path of moisture along the second power line 008 can be prolonged, and the moisture can be prevented from being introduced into the plurality of pixel units 002. Moreover, the side face of the other end of the first portion 0081 of the at least one second power line 008 within the region surrounded by the barrier structure 004 may be flat.

As can be seen by referring to FIG. 19, the display substrate may further include: a plurality of third power lines 020, which may be located on the base substrate 001. The plurality of third power lines 020 are electrically connected to transistors in the pixel units 002 in the display substrate. For example, it may be connected to sources or drains of transistors in the pixel units 002. The third power line 020 may be configured to provide positive power signals for the transistors in the pixel units 002, such that the third power line 020 may also be referred to as a VDD power line or a VDD trace.

In an embodiment of the present disclosure, the plurality of third power lines 020 may be symmetrically disposed on two sides of the at least one first power line 003. For example, referring to FIG. 19, the display substrate may include: four third power lines 020. Among them, two of the third power lines 020 may be located in the middle portion on the side of the barrier structure 004 distal from the plurality of pixel units 002, and the two third power lines 020 may be symmetrically disposed on two sides of the first power line 003 with respect to the longitudinal axis X of the base substrate 001. The remaining two third power lines 020 may both located at an edge on the side of the barrier structure distal from the plurality of pixel units 002. Each third power line 020 may be located on the side of one first portion 0081 of the second power line 008 proximal to the first power line 003.

Referring to FIG. 19, a plurality of tooth-shaped protruding structures may also be formed on side faces of the end of the plurality of third power lines 020 that are located at the side of the barrier structure 004 distal from the plurality of pixel units 002. Therefore, an entrance path of moisture along the third power lines 008 can be prolonged, and the moisture can be prevented from being introduced into the plurality of pixel units 002. Moreover, the side face of the other end of the third power line 020 that is within the region surrounded by the barrier structure 004 may be flat.

As can be seen by referring to FIGS. 2, 8 to 9, 15, and 17 to 19, the display substrate may further include: an encapsulation film layer 021. The encapsulation film layer 021 may be located on a side of the plurality of first power lines distal from the base substrate 001, and the encapsulation film layer 021 may cover the region surrounded by the barrier structure 004. Referring to FIG. 10, a boundary of the region 00g covered by the encapsulation film layer 021 may be located on a side of the barrier structure 004 distal from the plurality of pixel units 002.

In an embodiment of the present disclosure, the encapsulation film layer 021 may include: a first film layer 0211, a second film layer 0212, and a third film layer 0213 disposed in layers in a direction away from the base substrate 001.

Optionally, the first film layer 0211 and the third film layer 0213 may be made of inorganic materials, and the second film layer 0212 may be made of organic materials. For example, the first film layer 0211 and the third film layer 0213 may be made of one or more inorganic oxides such as SiNx, SiOx, and SiOxNy. The second film layer 0212 may be made of a material of resin. The resin may be a thermoplastic resin or a thermosetting resin. The thermoplastic resin may include an acrylic (PMMA) resin, and the thermosetting resin may include an epoxy resin.

It should be noted that the second film layer 0212 may be located within the region surrounded by the barrier structure 004, and the first film layer 0211 and the third film layer 0213 may cover the region surrounded by the banter structure 004 and cover the barrier structure 004. That is, the orthographic projection of the barrier structure 004 on the base substrate 001 is within the region covered by the encapsulation film layer 021. As such, the encapsulation film layer 021 is ensured to effectively encapsulate each structure in the region surrounded by the barrier structure 004.

In an embodiment of the present disclosure, the second film layer 0212 may be manufactured by an ink jet printing (IJP) method. The first film layer 0211 and the third film layer 0213 may be manufactured by a chemical vapor deposition (CVD) method.

Figure 20:
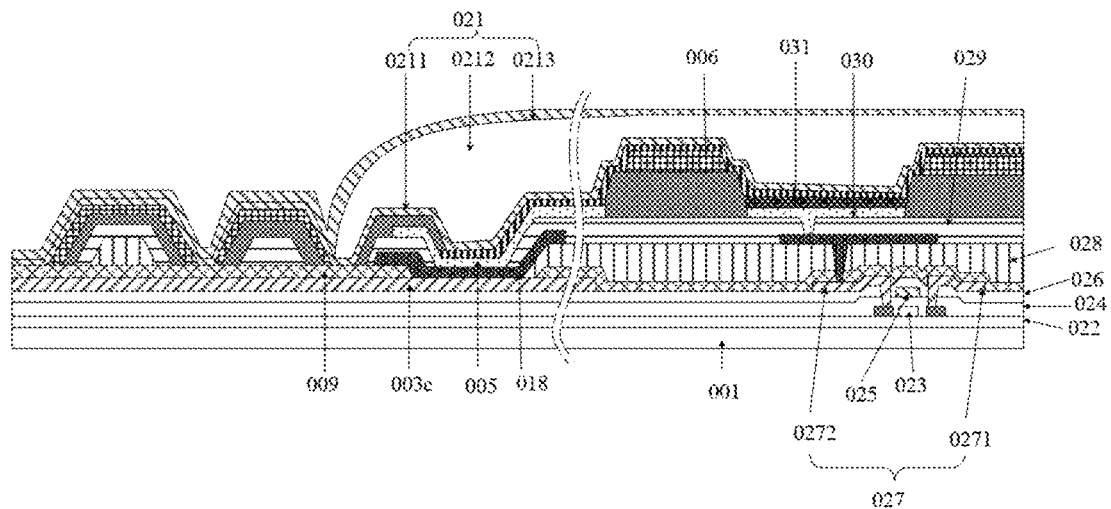
FIG. 20 is a schematic structural diagram of still another display substrate according to an embodiment of the present disclosure.

FIG. 20 is a schematic structural diagram of still another display substrate according to an embodiment of the present disclosure. As can be seen by referring to FIG. 20, a buffer layer 022, a semiconductor layer 023, a gate insulating layer 024, a gate 025, an interlayer dielectric layer 026 and a source-drain layer 027 may be sequentially disposed on the base substrate 001; and the source-drain layer 027 may include a source 0271 and a drain 0272. The source 0271 and the drain 0272 are spaced apart from each other and may be connected to the semiconductor layer 023 through via holes, respectively. A passivation layer 009, a first planarization layer 028, a second planarization layer 029, and a light-emitting element are sequentially disposed along a direction of the source-drain layer 027 away from the base substrate 001. The light-emitting element may include an anode layer 030, a light-emitting layer 031, and a cathode layer 006 which are sequentially disposed in layers. The anode layer 030 may be electrically connected to the drain 0272 through a via hole. Among them, the gate 025, the source 0271 and the drain 0272 constitute a transistor, and each light-emitting element and the transistor connected thereto may constitute a pixel unit 002.

As can be seen by referring to FIG. 20, the first metal layer 003c included in the first power line 003 may be disposed at the same layer as the source-drain layer 027. The adapting structure 005 may be disposed at the same layer as the anode layer 030 of the pixel. The adapting structure 005 may include three film layers. For example, the materials of the three film layers may sequentially be indium tin oxide (ITO), silver (Ag), and ITO.

Figure 21:
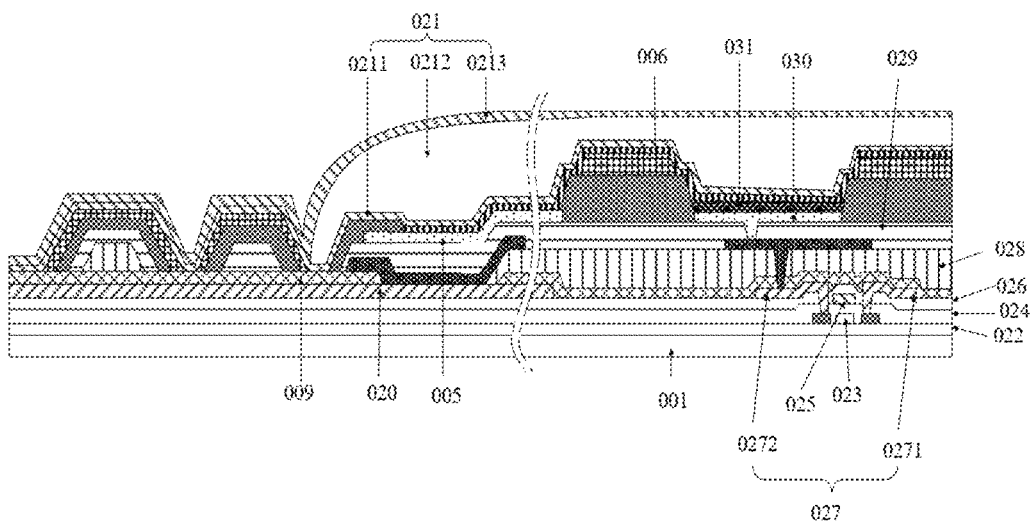
FIG. 21 is a schematic structural diagram of still another display substrate according to an embodiment of the present disclosure.

As can be seen by referring to FIG. 19, the orthographic projection of at least one of the plurality of third power lines 020 on the base substrate may be adjacent to the orthographic projection of the first power line 003 on the base substrate. FIG. 21 is a schematic structural diagram of still another display substrate according to an embodiment of the present disclosure. Referring to FIG. 21, the orthographic projections of the plurality of third power lines 020 on the base substrate 001 may have superimposing regions with the orthographic projection of the adapting structure 005 on the base substrate 001. Moreover, in the superimposing region, the passivation layer 009 may be provided between the plurality of third power lines 020 and the adapting structure 005. Moreover, the plurality of third power lines 020 are not in contact with the adapting structure 005.

In summary, the embodiments of the present disclosure provide a display substrate, which includes a base substrate, a plurality of pixel units, at least one first power line, a barrier structure, an adapting structure, a cathode layer and a first organic pattern. By covering at least part of the second side face of the adapting structure with the first organic pattern, the risk of the second side face of the adapting structure being eroded by moisture or oxygen due to the etching defects can be reduced, thereby guaranteeing that the adapting structure can effectively transmit power signals from the first power line. Moreover, as the first organic pattern is spaced apart from the barrier structure, the moisture brought in by the end of the first power line for receiving power signals can be prevented from being introduced into the pixel units through the barrier structure and the first organic pattern, thereby guaranteeing the yield of the display substrate, as well as the display effect of the display substrate.

Figure 22:
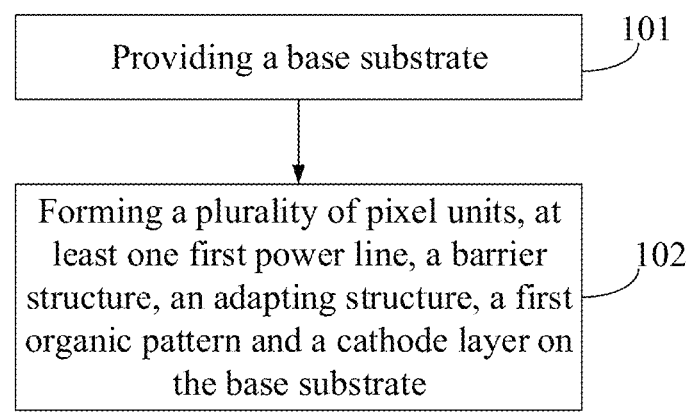
FIG. 22 is a flowchart of a method for manufacturing a display substrate according to an embodiment of the present disclosure.

FIG. 22 is a flowchart showing a method for manufacturing a display substrate according to an embodiment of the present disclosure. This method can be used for manufacturing the display substrate according to the embodiments above. As can be seen by referring to FIG. 22, the method may include:

In step 101, a base substrate is provided.

In step 102, a plurality of pixel units, at least one first power line, a barrier structure, an adapting structure, a first organic pattern and a cathode layer are formed on the base substrate.

One end 003a of the at least one first power line 003 may be located on a side of the barrier structure 004 distal from the plurality of pixel units 002 and is configured for receiving power signals, and the other end 003b is located between the barrier structure 004 and the plurality of pixel units 002 and is connected to the cathode layer 006 through the adapting structure 005. The barrier structure 004 may surround the plurality of pixel units 002.

The adapting structure 005 may include a first side face 005a and a second side face 005b opposite to each other. The side face 005a is closer to the plurality of pixel units 002 than the second side face 005b.

The first organic pattern 007 may cover at least part of the second side face 005b of the adapting structure 005; the orthographic projections of the first organic pattern 007 and the at least one first power line 003 on the base substrate 001 may overlap at the first overlapping regions 00b; and the first overlapping regions 00b and the orthographic projection of the barrier structure 004 on the base substrate 001 do not overlap.

It should be noted that in step 102 above, at least one first power line 003 may be first formed on the base substrate 001, and then a barrier structure 004 and an adapting structure 005 may be formed on the side of the first power line 003 distal from the base substrate 001. Then, a first organic pattern 007 is formed on the side of the adapting structure 005 distal from the base substrate 001, and a cathode layer 006 is formed on the side of the first organic pattern 007 distal from the base substrate 001.

Among them, the at least one first power line 003 may be formed with the sources and drains of the thin film transistors in the pixel units 002 through a single patterning process. The barrier structure 004 may be formed during the formation of the planarization layer, the pixel definition layer, and the photo spacer. The first organic pattern 005 may be formed during the formation of the pixel definition layer. The adapting structure 005 may be formed with the anode layer 030 in the pixel units 002 through a single patterning process.

In summary, the embodiments of the present disclosure provide a method for manufacturing a display substrate. The method may include: sequentially forming a plurality of pixel units, at least one first power line, a barrier structure, an adapting structure, a first organic pattern and a cathode layer on the base substrate. By covering at least part of the second side face of the adapting structure with the first organic pattern, the risk of the second side face of the adapting structure being eroded by moisture or oxygen due to the etching defects can be reduced, thereby guaranteeing that the adapting structure can effectively transmit power signals from the first power line. Moreover, as the first organic pattern is spaced apart from the barrier structure, the moisture brought in by the end of the first power line for receiving power signals can be prevented from being introduced into the pixel units through the barrier structure and the first organic pattern, thereby guaranteeing the yield of the display substrate, as well as the display effect of the display substrate.

The embodiments of the present disclosure further provide a display apparatus, which may include the display substrate described in the embodiment above. The display apparatus may be a foldable display apparatus, and for example, may be any product or component having a display function, such as a liquid crystal panel, a piece of electronic paper, an organic light-emitting diode (OLED) panel, an active-matrix organic light-emitting diode (AMOLED) panel, a mobile phone, a tablet computer, a television, a display, a notebook computer, a digital photo frame, or a navigator.

The foregoing descriptions are merely optional embodiments of the present disclosure, and are not intended to limit the present disclosure, Within the spirit and principles of the disclosure, any modifications, equivalent substitutions, improvements, etc., are within the protection scope of the present disclosure.

The invention claimed is:

1. A display substrate, comprising:
   a base substrate;
   a plurality of pixel units located on the base substrate;
   at least one first power line located on the base substrate;
   a barrier structure surrounding the plurality of pixel units;
   an adapting structure comprising a first side face and a second side face opposite to the first side face, the first side face being closer to the plurality of pixel units than the second side face;
   a cathode layer located on a side of the adapting structure distal from the base substrate; and
   a first organic pattern located on the side of the adapting structure distal from the base substrate,
   wherein one end of the at least one first power line is located on a side of the barrier structure distal from the plurality of pixel units, and is configured for receiving power signals; and the other end of the at least one first power line is located between the barrier structure and the plurality of pixel units, and is connected to the cathode layer through the adapting structure, and
   wherein the first organic pattern covers at least a portion of the second side face, an orthographic projection of the first organic pattern on the base substrate and an orthographic projection of the at least one first power line on the base substrate overlap at a first overlapping region, and the first overlapping region and an orthographic projection of the barrier structure on the base substrate do not overlap,
   wherein a plurality of tooth-shaped protruding structures are provided on a side face of the at least one first power line at the end of the barrier structure distal from the plurality of pixel units,
   wherein an orthographic projection of the protruding structures on the base substrate and the orthographic projection of the barrier structure on the base substrate do not overlap.

2. The display substrate according to claim 1, wherein the second side face comprises a portion covered by the first organic pattern and a portion covered by the barrier structure.

3. The display substrate according to claim 1,
wherein a distance between the first overlapping region and the orthographic projection of the barrier structure on the base substrate is greater than a distance threshold in a range from 80 microns to 150 microns.

4. The display substrate according to claim 1, further comprising: at least one second power line, wherein the at least one second power line comprises a first portion and a second portion;
the first portion is located on the side of the barrier structure distal from the plurality of pixel units, and is configured for receiving a power signal;
the second portion is connected to the cathode layer through the adapting structure; and
the second portion comprises a first junction and a second junction that are connected to the adapting structure, and a distance between the first junction and the barrier structure is greater than a distance between the second junction and the barrier structure.

5. The display substrate according to claim 4, wherein the display substrate has at least one selected from:
a bonding region located on the side of the barrier structure distal from the plurality of pixel units, wherein the first junction is closer to the bonding region than the second junction; or
a row driving region between the plurality of pixel units and the barrier structure, wherein a distance between the orthographic projection of the at least one first power line on the base substrate and the row driving region is greater than a distance between an orthographic projection of the at least one second power line on the base substrate and the row driving region.

6. The display substrate according to claim 1,
wherein the adapting structure is in a ring construction surrounding the plurality of pixel units, and/or
wherein an orthographic projection of the adapting structure on the base substrate has a first projection region and a second projection region, the first projection region and the orthographic projection of the barrier structure on the base substrate do not overlap, and the second projection region and the orthographic projection of the barrier structure on the base substrate overlap at a second overlapping region; and wherein the first projection region is closer to the end of the at least one first power line for receiving the power signal, than the second projection regions.

7. The display substrate according to claim 4, wherein the display substrate further comprises at least one selected from:
a passivation layer covering the at least one first power line, wherein an opening is further provided in the passivation layer, the adapting structure is connected to the at least one first power line through the opening at a side proximal to the base substrate, and the adapting structure is connected to the cathode layer at a side distal from the base substrate;
an encapsulation film layer, wherein the encapsulation film layer is located on a side of the first power line distal from the base substrate, and the encapsulation film layer covers a region surrounded by the barrier structure; or
a plurality of third power lines located on the base substrate, wherein the plurality of third power lines are electrically connected to transistors in the pixel units.

8. The display substrate according to claim 1,
wherein the barrier structure comprises: a first barrier dam and a second barrier dam; the first barrier dam is farther from the plurality of pixel units relative to the second barrier dam, and a thickness of the first barrier dam is greater than a thickness of the second barrier dam; the first barrier dam comprises: a first planarization layer pattern, a second planarization layer pattern, and a second organic pattern which are arranged along a direction away from the base substrate; the second barrier dam comprises: a third planarization layer pattern and a third organic pattern which are arranged along a direction away from the base substrate; wherein the second planarization layer pattern and the third planarization layer pattern comprise a same material, and the first organic pattern, the second organic pattern and the third organic pattern comprise a same material, or,
wherein the barrier structure comprises: a first barrier dam and a second barrier dam; the first barrier dam is farther from the plurality of pixel units relative to the second barrier dam, and a thickness of the first barrier dam is greater than a thickness of the second barrier dam; the first barrier dam comprises: a planarization layer pattern and a second organic pattern which are sequentially arranged in layers along a direction away from the base substrate; the second barrier dam comprises: a third organic pattern arranged on the base substrate, and wherein the first organic pattern, the second organic pattern and the third organic pattern comprise a same material.

9. The display substrate according to claim 8, wherein the first barrier dam further comprises: a fourth organic pattern arranged on a side of the second organic pattern distal from the base substrate;
the second barrier dam further comprises: a fifth organic pattern arranged on a side of the third organic pattern distal from the base substrate; and
the fourth organic pattern and the fifth organic pattern comprise a same material.

10. The display substrate according to claim 6, wherein the barrier structure comprises: a first barrier dam and a second barrier dam;
the first barrier dam is farther from the plurality of pixel units relative to the second barrier dam, and a thickness of the first barrier dam is greater than a thickness of the second barrier dam;
the first organic pattern has a portion which is in direct contact with the second barrier dam.

11. The display substrate according to claim 10, wherein the second power line in the display substrate comprises: a straight portion and an arc-shaped portion which surround a region where the plurality of pixel units are located; and
an orthographic projection of the portion of the first organic pattern which is in direct contact with the second barrier dam on the base substrate is located within an orthographic projection of the arc-shaped portion on the base substrate.

12. The display substrate of claim 11, wherein the straight portion and the arc-shaped portion which surround the region where the plurality of pixel units are located are comprised in the second portion of the second power line.

13. The display substrate according to claim 8, wherein the first barrier dam is a first ring, and the second barrier dam is a second ring;
the first organic pattern and a part of the third organic pattern define a third ring, an orthographic projection of the third ring on the base substrate is located within an orthographic projection of the second ring on the base substrate, and the orthographic projection of the second ring on the base substrate is located within an orthographic projection of the first ring on the base substrate,
wherein the third ring surrounds the plurality of pixel units.

14. The display substrate according to claim 1, wherein the at least one first power line comprises: a first metal layer and a second metal layer which are arranged along a direction away from the base substrate; and
the second metal layer is in contact with the adapting structure at a side distal from the first metal layer.

15. The display substrate according to claim 7,
wherein an orthographic projection of at least one of the plurality of third power lines on the base substrate is adjacent to the orthographic projection of the first power line on the base substrate; and
an orthographic projection of the plurality of third power lines on the base substrate and the orthographic projection of the adapting structure on the base substrate have a superimposing region, and the passivation layer is disposed between the plurality of third power lines and the adapting structure and within the superimposing regions.

16. A display substrate, comprising:
a base substrate;
a plurality of pixel units located on the base substrate;
at least one power line located on the base substrate;
a barrier structure surrounding the plurality of pixel units, wherein an orthographic projection of the power line on the base substrate passes across an orthographic projection of the barrier structure on the base substrate;
an adapting structure comprising a first side face and a second side face opposite to the first side face, wherein the first side face is closer to the plurality of pixel units than the second side face;
a cathode layer located on a side of the adapting structure distal from the base substrate;
a first organic pattern located on the side of the adapting structure distal from the base substrate; and
a passivation layer covering the at least one power line,
wherein an opening is further provided in the passivation layer, the adapting structure is connected to the at least one power line through the opening at a side proximal to the base substrate, and the adapting structure is connected to the cathode layer at a side distal from the base substrate,
wherein a plurality of tooth-shaped protruding structures are provided on a side face of the at least one power line at the end of the barrier structure distal from the plurality of pixel units,
wherein an orthographic projection of the protruding structures on the base substrate and the orthographic projection of the barrier structure on the base substrate do not overlap.

17. A display apparatus, comprising: the display substrate according to claim 1.

18. A display substrate, comprising:
a base substrate;
a plurality of pixel units located on the base substrate;
at least one first power line located on the base substrate;
a barrier structure surrounding the plurality of pixel units;
an adapting structure comprising a first side face and a second side face opposite to the first side face, the first side face being closer to the plurality of pixel units than the second side face;
a cathode layer located on a side of the adapting structure distal from the base substrate; and
a first organic pattern located on the side of the adapting structure distal from the base substrate,
wherein one end of the at least one first power line is located on a side of the barrier structure distal from the plurality of pixel units, and is configured for receiving power signals; and the other end of the at least one first power line is located between the barrier structure and the plurality of pixel units, and is connected to the cathode layer through the adapting structure, and
wherein the first organic pattern covers at least a portion of the second side face, an orthographic projection of the first organic pattern on the base substrate and an orthographic projection of the at least one first power line on the base substrate overlap at a first overlapping region, and the first overlapping region and an orthographic projection of the barrier structure on the base substrate do not overlap,
wherein the at least one first power line comprises: a first metal layer; the display substrate further comprises: an auxiliary metal layer located on a side of the first metal layer distal from the base substrate; and
the auxiliary metal layer is in contact with the adapting structure at a side distal from the first metal layer, and an orthographic projection of the auxiliary metal layer on the base substrate and an orthographic projection of the barrier structure on the base substrate do not overlap.

* * * * *